United States Patent [19]
Matsushita et al.

[11] Patent Number: 6,084,815
[45] Date of Patent: Jul. 4, 2000

[54] SEMICONDUCTOR DEVICE

[75] Inventors: Yuichi Matsushita; Kenji Satou, both of Miyazaki, Japan

[73] Assignee: Oki Electric Industry Co., Ltd., Tokyo, Japan

[21] Appl. No.: 09/241,414

[22] Filed: Feb. 2, 1999

[30] Foreign Application Priority Data

Feb. 27, 1998 [JP] Japan .................................. 10-064487

[51] Int. Cl.$^7$ .................................................. G11C 7/00
[52] U.S. Cl. ................ 365/225.7; 365/200; 365/230.06; 365/230.04
[58] Field of Search ................................ 365/225.7, 200, 365/201, 230.03, 230.06, 230.04

[56] References Cited

U.S. PATENT DOCUMENTS

| | | | |
|---|---|---|---|
| 5,576,999 | 11/1996 | Kim et al. ................................. | 365/200 |
| 5,689,465 | 11/1997 | Sukegawa et al. ...................... | 365/200 |
| 5,742,547 | 4/1998 | Lee .......................................... | 365/200 |
| 5,848,007 | 12/1998 | Takahashi ................................ | 365/200 |
| 5,970,003 | 10/1999 | Miyatake et al. ........................ | 365/200 |

FOREIGN PATENT DOCUMENTS

| | | |
|---|---|---|
| 2-209751 | 8/1990 | Japan . |
| 5-335507 | 12/1993 | Japan . |
| 9-69299 | 3/1997 | Japan . |
| 9-120695 | 5/1997 | Japan . |

*Primary Examiner*—Viet Q. Nguyen
*Attorney, Agent, or Firm*—Jones Volentine, L.L.P.

[57] ABSTRACT

A semiconductor device includes plural fuse wiring paths which extend substantially parallel to each other in a first direction, each of the fuse wiring paths having a fuse element. A normal column line extends in a second direction substantially perpendicular to the first direction, the normal column line corresponding to a normal memory cell which stores data. The semiconductor memory device further includes a redundant column line extending in the second direction, the redundant column line corresponding to a redundant memory cell which stores data. A logic circuit receives respective signals on the plural fuse wiring paths, and outputs a selection signal according to these signals. The semiconductor device also includes a switching circuit coupled between the logic circuit and the normal and redundant column lines, which receives an address signal and the selection signal, and which selectively transfers the address signal to the normal column line or the redundant column line in response to the selection signal.

15 Claims, 18 Drawing Sheets

| FNA1 | FNA2 | FD10 | FD11 | FD12 |
|------|------|------|------|------|
| H    | H    | H    | H    | H    |
| L    | H    | L    | H    | H    |
| H    | L    | L    | L    | H    |
| L    | L    | L    | L    | L    |

SEMICONDUCTOR DEVICE

BACKGROUND OF THE INVENTION

1. Field of the Invention

The present invention generally relates to a semiconductor memory device. More specifically, the present invention relates to a semiconductor memory device with a redundant fuse circuit, such as Random Access Memory or other memory device.

This application is a counterpart of Japanese patent application, Serial Number 064487/1998, filed Feb. 27, 1998, the subject matter of which is incorporated herein by reference.

2. Description of the Related Art

In addition to increases memory capacities and memory densities being provided in a single chip, the semiconductor memory devices are also now provided with both redundant memory cells and normal memory cells. If a normal memory cell has a defect, the redundant memory cell is substituted for the defective memory cell. As a result, a faulty chip may be repaired or fixed. In this technical field, the technique mentioned above is widely used. A shift type redundant circuit is an example of a conventional technique.

A conventional circuit diagram is shown in FIG. 18. The conventional circuit has normal column lines CL0 to CL7 and redundant column lines RCL0 and RCL1. All the column lines are extended in the same direction (That is, the horizontal direction of FIG. 18) and separated from each other at regular intervals. The conventional circuit also has a fuse wiring path FL which includes four fuses F1 to F4. The fuse wiring path FL is extended in the vertical direction of FIG. 18, perpendicular to the horizontal direction.

In the conventional circuit, the intervals of the column lines must be reduced in order to increase the integration density. However, these intervals depend upon the size of the fuse that is extended in the vertical direction. That is, the fuse must have an appropriate area for use as the target of laser beams. Although it is desired to improve the integration density of the memory device, it is not a simple task to achieve this goal by reducing the fuse dependent intervals.

There has been a need for a semiconductor having an improved integration density.

SUMMARY OF THE INVENTION

It is an object of the present invention to provide a semiconductor memory device having an improved integration density.

According to one aspect of the present invention, for achieving the above object, there is provided a semiconductor device includes plural fuse wiring paths which extend substantially parallel to each other in a first direction, each of the fuse wiring paths having a fuse element, and a normal column line extending in a second direction substantially perpendicular to the first direction, the normal column line corresponding to a normal memory cell which stores data. The semiconductor device further includes a redundant column line extending in the second direction, the redundant column line corresponding to a redundant memory cell which stores data, and a logic circuit receives respective signals on the plural fuse wiring paths, and which outputs a selection signal according to these signals. The semiconductor device also includes a switching circuit coupled between the logic circuit and the normal and redundant column lines which receives an address signal, and which selectively transfers the address signal to the normal column line or the redundant column line in response to the selection signal.

The above and further objects and novel features of the invention will more fully appear from the following detailed description, appended claims and the accompanying drawings.

BRIEF DESCRIPTION OF THE DRAWINGS

FIG. 17 is a truth table showing the potential level of output signals of a fuse selection decoder in FIG. 15.

DETAILED DESCRIPTION OF THE PREFERRED EMBODIMENTS

First Embodiment

A semiconductor memory device according to a first preferred embodiment of the present invention will be explained hereinafter in detail with reference to FIG. 1 and FIG. 2.

Figure 1:
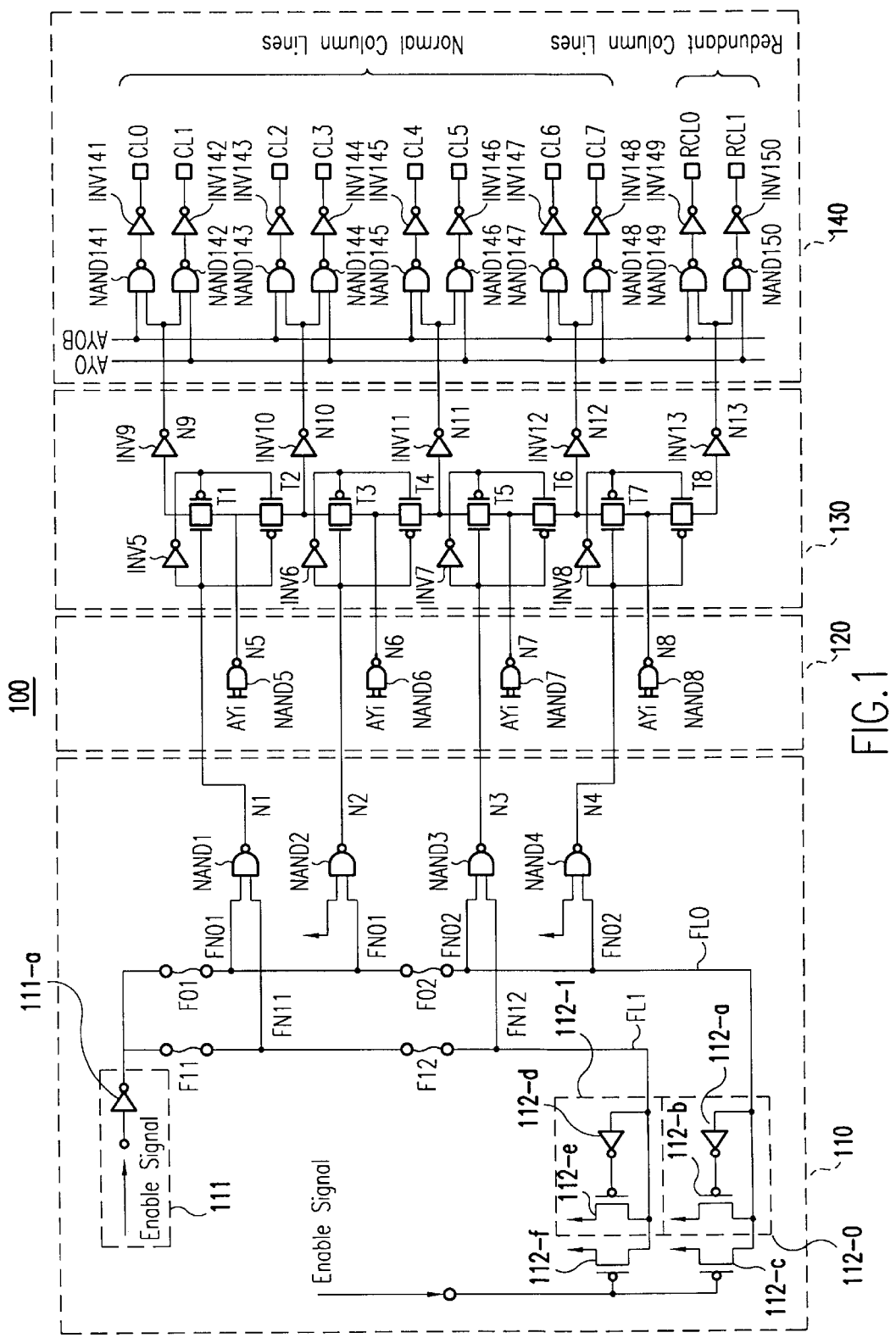
FIG. 1 is a circuit diagram showing a semiconductor memory device according to a first preferred embodiment.

FIG. 1 is a circuit diagram showing a semiconductor memory device according to the first preferred embodiment of the present invention. The semiconductor memory device is, for example, a general purpose Dynamic Random Access Memory (DRAM). FIG. 1 shows a part of one memory block which includes a redundant circuit. Actually, the semiconductor memory device, such as a DRAM, has a plurality of memory blocks in a semiconductor chip. In order to simplify the explanation, the present invention will be explained by using one memory block such as FIG. 1.

The semiconductor memory device 100 has a redundant fuse circuit 110, a column decoder 120, a column decoder output switching circuit 130 and a column driver 140.

The redundant fuse circuit 110 has a first fuse wiring path FL0 and a second fuse wiring path FL1. The first fuse wiring path FL0 includes fuses F01 and F02, which are connected in series. The second fuse wiring path FL1 includes fuses F11 and F12, which are connected in series. These fuses can be cut using a laser beam.

The redundant fuse circuit 110 also has a fuse driver 111, and first and second fuse node clamping circuits 112-0, 112-1. The fuse driver 111 is comprised an inverter 111-a which has an input terminal which receives an enable signal and an output terminal connected to the one ends of the fuses F01, F11. The first fuse node clamping circuit 112-0 is comprised an inverter 112-a and two P-type MOS transistors (hereinafter referred to as PMOS) 112-b, 112-c and is connected to the fuse node FN02. The inverter 112-a has an input terminal connected to the fuse node FN02 and an output terminal connected to a gate of the PMOS 112-b. The PMOS 112-b has a source connected to a power supply (such as VCC) and a drain connected to the fuse node FL02. The PMOS 112-c has a gate which receives the enable signal, a source connected to the power supply and a drain connected to the fuse node FL02. The second fuse node clamping circuit 112-1 is comprised an inverter 112-d and two PMOS 112-e, 112-f and is connected to the fuse node FN12. The inverter 112-d has an input terminal connected to the fuse node FN12 and an output terminal connected to a gate of the PMOS 112-e. The PMOS 112-e has a source connected to the power supply and a drain connected to the fuse node FL12. The PMOS 112-f has a gate which receives the enable signal, a source connected to the power supply and a drain connected to the fuse node FL12.

The redundant fuse circuit 110 further has NAND circuits NAND1 to NAND4. The NAND1 has a first input terminal connected to a fuse node FN01 and a second input terminal connected to a fuse node FN11 and an output terminal connected to a node N1. The fuse node FN01 is located between the fuse F01 and the fuse F02. The fuse node FN11 is located between the fuse F11 and the fuse F12. The NAND2 has a first input terminal connected to the fixed voltage (for example, the power supply VCC) and a second input terminal connected to the fuse node FN01 and an output terminal connected to a node N2. The NAND3 has a first input terminal connected to the fuse node FN02 and a second input terminal connected to the fuse node FN12 and an output terminal connected to a node N3. The fuse node FN02 is located between the fuse F02 and the first fuse node clamping circuit 112-0. The fuse node FN12 is located between the fuse F12 and the second fuse node clamping circuit 112-1. The NAND4 has a first input terminal connected to the fixed voltage (for example, the power supply VCC) and a second input terminal connected to the fuse node FN02 and an output terminal connected to a node N4. The nodes N1 through N4 are output terminals of the redundant fuse circuit 110. The signals on nodes N1 through N4 are transmitted to the column decoder output switching circuit 130.

The column decoder 120 has NAND circuits NAND5 through NAND8 each of which decodes a column address signal AYi and outputs a decoded column address signal to nodes N5 through N8.

The column decoder output switching circuit 130 has inverters INV5 through INV8 and transmission gates T1 trough T8. These elements have a function for transmitting the decoded column address signal to inverters INV9 through INV13. The upper side of the transmission gates T1, T3, T5 and T7 and the lower side of the transmission gates T2, T4, T6 and T8 are selectively activated according to the output signal of the redundant fuse circuit 110. That is, when the signal on the node N1 is in the H level, the transmission gate T1 turns on and the transmission gate T2 turns off. Therefore, the decoded column address signal on the node N5 is transferred to the inverter INV9 through the transmission gate T1. On the contrary, when the signal on the node N1 is in the L level, the transmission gate T2 turns on and the transmission gate T1 turns off. Therefore, the decoded column address signal on the node N5 is transferred to the inverter INV10 through the transmission gate T2. With regard to the decoded column address signals N6 through N8, the mechanism for transmitting the decoded column address signals is the same as the decoded column address signal N5 thereof.

The column decoder output switching circuit 130 also has inverters INV9 through INV13. The inverters INV9 through INV13 are arranged between each of the respective transmission gates and the column driver 140.

The column driver 140 has NAND circuits NAND141 through NAND150 and inverters INV141 through INV150. These NAND circuits have a function for decoding the decoded column address signals, which pass through the column decoder output switching circuit 130, in response to the column address signals AY0 and AY0B.

The column decoder output switching circuit 130 can not drive the column lines directly because the column lines have a load that is too large. (The load, for example, includes wiring capacitance and wiring resistance) Therefore, the NAND circuits and the inverters are used for directly driving the column lines.

When the column address AY0B and the node N9 are in the H level (that is, the column address AY0 is in the L level), the normal column line CL0 is driven and the normal column line CL1 is not driven. When the column address AY0 and the node N9 are in the H level (that is, the column address AY0B is in the L level), the normal column line CL1 is driven and the normal column line CL0 is not driven. The mechanism of driving the column lines, with regard to the signals on the nodes N10 through N13, is the same as the signal on the node N9.

Next, the operation of the semiconductor memory device as shown in FIG. 1 will be explained with reference to FIG. 2(A) through FIG. 2(C).

Case 1: No Fuses Have Been Cut

Figure 2A:
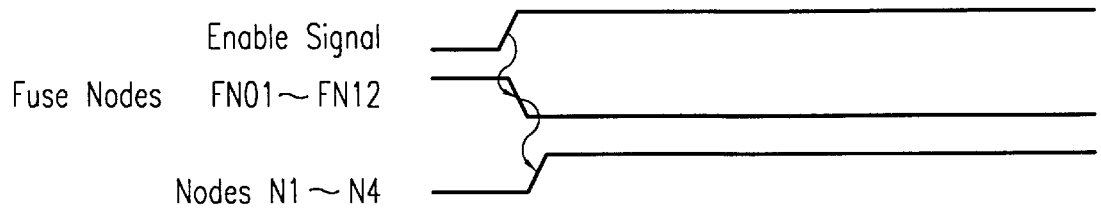
FIG. 2(a) to FIG. 2(c) are timing charts showing an operation of the first preferred embodiment.

FIG. 2(A) is a timing chart showing an operation of the present invention in the case where none of the fuses have been cut. That is, in this case, the redundant column lines RCL0 and RCL1 are not used.

When the enable signal is in the L level, the state of the memory device is not in a data reading mode or a data writing mode. Therefore, the fuse driver 111 outputs the H level in this period. The fuse node clamping circuits 112-0 and 112-1 output the H level because the transistors 112-b through 112-e are the on state. Therefore, all the fuse nodes FN01 through FN12 are in the H level in this period.

When the enable signal is changed from the L level to the H level, the state of the memory device changes to the data reading mode or the data writing mode. The fuse wiring paths FL0 and FL1 are driven by the fuse driver 111 to the L level. (That is, all the fuse nodes FN01, FN02, FN11 and FN12 are in the L level.) Since at least one of the input terminals of each NAND circuits NAND1 through NAND4 receive the L level, the nodes N1 through N4 are changed from the L level to the H level. So, the transmission gates T1, T3, T5 and T7 turn on and the transmission gates T2, T4, T6 and T8 turn off. (That is, only the upper sides of the transmission gates turn on.) The decoded column signals on the nodes N5 through N8 are transmitted to the nodes N9 through N12 respectively. If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected in response to the column address signals AY0 and AY0B. For example, when the column address signal AY0B is in the H level, the inverter INV141 outputs a normal column line selection signal having the H level to the normal column line CL0. As a result, a transmission gate (not shown in the figure), which has a control terminal connected to the normal column line CL0, is in an active state and the data stored in the memory cell (not shown in the figure) which is connected to the transmission gate, is transferred to a data line through the activated transmission gate.

The operation for selecting the normal column lines CL1 through CL7 is the same as that for selecting the normal column line CL0.

As explained above, only the normal column lines CL0 through CL7 are used in this case where none of the fuses have been cut because the upper side transmission gates are activated. (The redundant column lines RCL0 and RCL1 are not used in this case because the lower side transmission gates are not activated.) That is, this operation indicates that the semiconductor memory device does not have any defective memory cells.

Case 2: Fuses F01 and F11 Have Been Cut

Figure 2B:
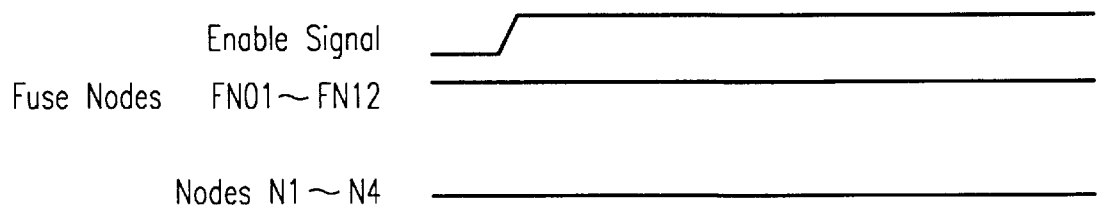

FIG. 2(B) is a timing chart showing an operation of the present invention in the case where the fuses F01 and F11 have been cut. That is, in this case, the redundant column lines RCL0 and RCL1 are used.

When the enable signal is in the L level, the state of the memory device is not in the data reading mode or the data writing mode. Therefore, the fuse driver 111 outputs the H level in this period. The fuse node clamping circuits 112-0 and 112-1 output the H level because the transistors 112-b through 112-e are the on state. Therefore, all the fuse nodes FN01 through FN12 are in the H level in this period.

When the enable signal is changed from the L level to the H level, the state of the memory device changes to the data reading mode or the data writing mode. The fuse nodes FN01 through FN12 are not driven by the fuse driver 111 because the fuses F11 and F01 have been cut. The potential level on the fuse nodes FN01, FN02, FN11 and FN12 are still in the H level and are clamped by the fuse node clamping circuits 112-0 and 112-1.

Since all the input terminals of each NAND circuits NAND1 through NAND4 receive the H level, the nodes N1 through N4 are in the L level. So, the transmission gates T2, T4, T6 and T8 turn on and the transmission gates T1, T3, T5 and T7 turn off. (That is, only the lower sides of the transmission gates turn on.) The decoded column address signals on the nodes N5 through N8 are transmitted to the nodes N10 through N13 (not N9) respectively. If the column decoder 120 decodes the column address signal AYi and outputs the decoded column address signal having the L level to the node N5, the column decoder output switching circuit 130 outputs the signal having the H level to the node N10.

Therefore, one of the normal column lines CL2 and CL3 is selected instead of the normal column lines CL0 and CL1. For example, when the column address signal AY0B is in the H level, the inverter INV143 outputs a normal column line selection signal having the H level to the normal column line CL2. As a result, a transmission gate (not shown in the figure), which has a control terminal connected to the normal column line CL2, is in an active state and the data stored in the memory cell (not shown in the figure) which is connected to the transmission gate, is transferred to a data line through the activated transmission gate.

The operation for selecting the normal column lines CL3 through CL7 is the same as that for selecting the normal column line CL2.

If the column decoder 120 decodes the column address signal AYi and outputs the decoded column address signal having the L level to the node N8, the column decoder output switching circuit 130 outputs the signal having the H level to the node N13.

Therefore, one of the redundant column lines RCL0 and RCL1 is selected instead of the normal column lines CL6 and CL7. For example, when the column address signal AY0B is in the H level, the inverter INV149 outputs a redundant column line selection signal having the H level to the redundant column line RCL0. As a result, a transmission gate (not shown in the figure), which has a control terminal connected to the redundant column line RCL0, is in an active state and the data stored in the redundant memory cell (not shown in the figure) which is connected to the transmission gate, is transferred to a data line through the activated transmission gate.

As explained above, the normal column lines CL0 and CL1 are not used and the redundant column lines RCL0 and RCL1 are used in this case where the fuses F11 and F01 have been cut. This is because the memory cell that is selected by one of the normal column lines CL0 and CL1 has a defect. That is, this operation indicates that the redundant memory cell is substituted for the defective memory cell.

Case 3: Fuses F01 and F12 Have Been Cut

Figure 2C:
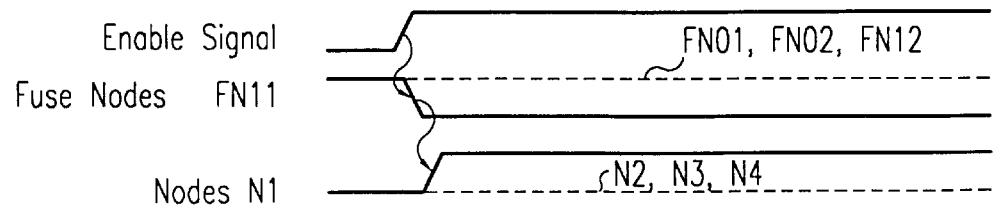

FIG. 2(C) is a timing chart showing an operation of the present invention in the case where the fuses F01 and F12 are cut. That is, in this case, the redundant column lines RCL0 and RCL1 are used.

When the enable signal is in the L level, the state of the memory device is not in the data reading mode or the data writing mode. Therefore, the fuse driver 111 outputs the H level in this period. The fuse node clamping circuits 112-0 and 112-1 output the H level because the transistors 112-b through 112-e are the on state. Therefore, all the fuse nodes FN01 through FN12 are in the H level in this period.

When the enable signal is changed from the L level to the H level, the state of the memory device changes to the data reading mode or the data writing mode. The fuse nodes FN01, FN02 and FN12 are not driven by the fuse driver 111 because the fuses F01 and F12 have been cut. Only the fuse node FN11 is driven by the fuse driver 111 because the fuse F11 has not been cut. The potential level on these fuse nodes FN01, FN02 and FN12 are still in the H level and are clamped by the fuse node clamping circuits 112-0 and 112-1. Only the fuse node FN11 is in the L level.

Since all the input terminals of each NAND circuits NAND2 through NAND4 receive the H level and one of the input terminals of NAND circuit NAND1 receives the L level, the node N1 is in the H level and the nodes N2 through N4 are in the L level. So, the transmission gates T1, T4, T6 and T8 turn on and the transmission gates T2, T3, T5 and T7 turn off.

The decoded column address signal on the node N5 is transmitted to the node N9. The decoded column signals on the nodes N6 through N8 are transmitted to the nodes N11 through N13 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected. For example, when the column address signal AY0B is in the H level, the inverter INV141 outputs the normal column line selection signal having the H level to the normal column line CL0.

If the column decoder 120 decodes the column address signal AYi and outputs the decoded column address signal having the L level to the node N6, the column decoder output switching circuit 130 outputs the signal having the H level to the node N11. Therefore, one of the normal column lines CL4 and CL5 is selected instead of the normal column lines CL2 and CL3. For example, when the column address signal AY0B is in the H level, the inverter INV145 outputs the normal column line selection signal having the H level to the normal column line CL4.

If the column decoder 120 decodes the column address signal AYi and outputs the decoded column address signal having the L level to the node N8, the column decoder output switching circuit 130 outputs the signal having the H level to the node N13. Therefore, one of the redundant column lines RCL0 and RCL1 is selected instead of the normal column lines CL6 and CL7. For example, when the column address signal AY0B is in the H level, the inverter INV149 outputs a redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL2 and CL3 are not used and the redundant column lines RCL0 and RCL1 are used in this case where the fuses F01 and F12 have been cut. This is because the memory cell that is selected by one of the normal column lines CL2 and CL3 has a defect. That is, this operation indicates that the redundant memory cell is substituted for the defective memory cell.

If a memory cell associated with the normal column lines CL4 and CL5 has a defect, the defective memory cell can be replaced with redundant memory cell by cutting the fuses F02 and F11 (or by cutting the fuses F02 and F12). If a memory cell associated with the normal column lines CL6 and CL7 has a defect, the defective memory cell can be replaced with redundant memory cell by cutting the fuse F02.

As mentioned above, the semiconductor memory device of the first preferred embodiment has a plurality of fuse wiring paths each of which includes a fuse and extends parallel to each other. Each of the fuse wiring paths is extended in the first direction perpendicular to the second direction in which the column lines are extended. As a result, the number of the fuses per fuse wiring path can be redeuced. Therefore, enough space is provided to facilitate arrangement of the fuses on the fuse wiring paths.

Furthermore, even though the intervals of the column lines may be reduced, sufficient area for use as the target of laser beams is maintained. That is, the present embodiment provides a mechanism for improving integration density.

Second Embodiment

A semiconductor memory device according to a second preferred embodiment of the present invention will be explained hereinafter in detail with reference to FIG. 3 and FIG. 4.

Figure 3:
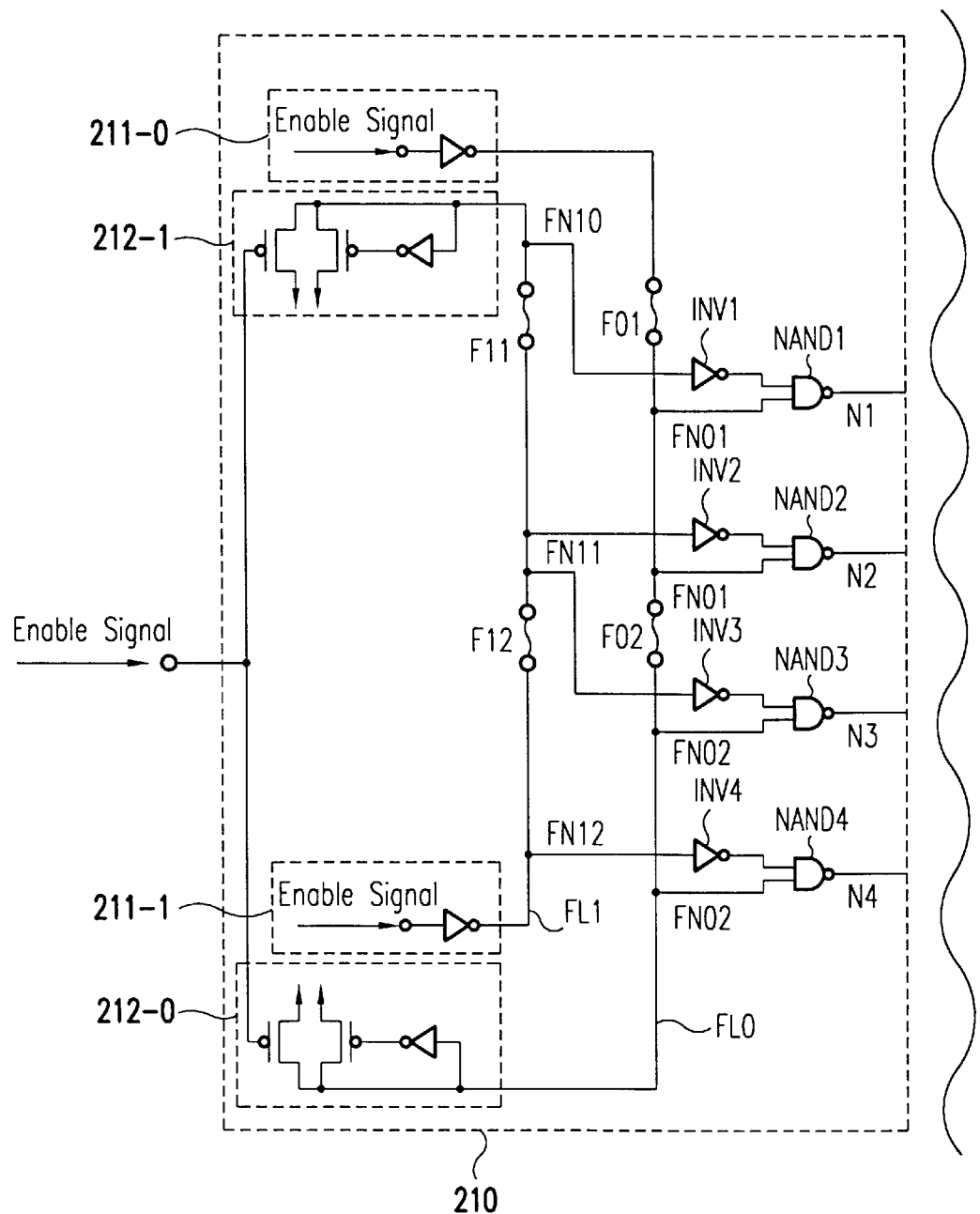
FIG. 3 is a circuit diagram showing a semiconductor memory device according to a second preferred embodiment.

FIG. 3 is a circuit diagram showing a semiconductor memory device according to the second preferred embodiment of the present invention. The difference between the second embodiment and the first embodiment resides in the circuit scheme of the redundant fuse circuit 210. The redundant fuse circuit 210 is a variation of the redundant circuit 110 of FIG. 1. The diagram of the column decoder 120, the column decoder output switching circuit 130 and the column driver 140 are omitted from FIG. 3.

One feature of the second embodiment is that one of the fuse clamping circuit 212-1 is connected to the upper portion of the fuse wiring path FL1 and the fuse driver 211-1 is connected to the lower portion of the fuse wiring path FL1 as illustrated in FIG. 3. That is, the locations in which the fuse clamping circuit 212-1 and the fuse driver 211-1 are arranged opposite to that of the first embodiment. Furthermore, another feature of the second embodiment is that one of the input terminals of each NAND circuits NAND1 through NAND4 is connected to the fuse wiring path FL1 through inverters INV1 to INV4 as illustrated as FIG. 3.

The redundant fuse circuit 210 has the first fuse wiring path FL0 and the second fuse wiring path FL1. The first fuse wiring path FL0 includes fuses F01 and F02, which are connected in series. The second fuse wiring path FL1 includes fuses F11 and F12, which are connected in series. These fuses can be cut using a laser beam.

The redundant fuse circuit 210 also has fuse drivers 211-0, 211-1 and first and second fuse node clamping circuits 212-0, 212-1.

The fuse drivers 211-0, 211-1 and the fuse node clamping circuits 212-0, 212-1 have the same elements of the fuse driver and the fuse node clamping circuit of the first embodiment.

The redundant fuse circuit 210 further has NAND circuits NAND1 to NAND4. The NAND1 has a first input terminal connected to a fuse node FN01, a second input terminal connected to a fuse node FN10 through the inverter INV1 and an output terminal connected to the node N1. The fuse node FN10 is located between the fuse node clamping circuit 212-1 and the fuse F11.

The NAND2 has a first input terminal connected to the fuse node FN01, a second input terminal connected to the fuse node FN11 through the inverter INV2 and an output terminal connected to a node N2. The NAND3 has a first input terminal connected to a fuse node FN02, a second input terminal connected to a fuse node FN11 through the inverter INV3 and an output terminal connected to a node N3. The NAND4 has a first input terminal connected to the fuse node FN02, a second input terminal connected to the fuse node FN12 through the inverter INV4 and an output terminal connected to a node N4. The nodes N1 through N4 are output terminals of the redundant fuse circuit 210. The signals on nodes N1 through N4 are transmitted to the column decoder output switching circuit 130.

Next, the operation of the semiconductor memory device as shown in FIG. 3 will be explained with reference to FIG. 4(A) through FIG. 4(C).

Case 1: No Fuses Have Been Cut

Figure 4A:
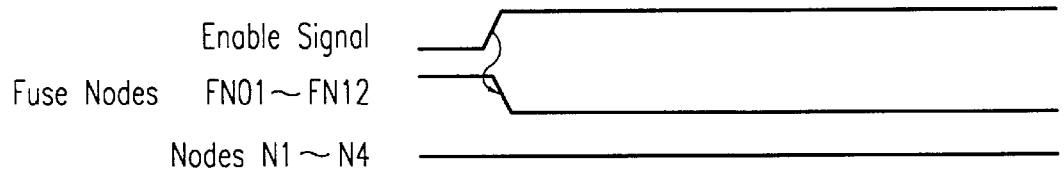
FIG. 4(a) to FIG. 4(c) are timing charts showing an operation of the second preferred embodiment.

FIG. 4(A) is a timing chart showing an operation of the present invention in the case where none of the fuses have been cut. That is, in this case, the redundant column lines RCL0 and RCL1 are not used.

When the enable signal is in the L level, the state of the memory device is not in the data reading mode or the data writing mode. Therefore, the fuse drivers 211-0, 211-1 output the H level in this period. The fuse node clamping circuits 212-0 and 212-1 output the H level. Therefore, all the fuse nodes FN01 through FN12 are in the H level in this period. The nodes N1 through N4 are also in the H level.

When the enable signal is changed from the L level to the H level, the state of the memory device changes to the data reading mode or the data writing mode. The fuse wiring paths FL0 and FL1 are driven by the fuse driver 211-0, 211-1 to the L level. (That is, all the fuse nodes FN01, FN02, FN10 FN11 and FN12 are in the L level.) Since at least one of the input terminals of each NAND circuits NAND1 through NAND4 receive the L level, the nodes N1 through N4 are in the H level. So, the transmission gates T1, T3, T5 and T7 turn on and the transmission gates T2, T4, T6 and T8 turn off. (That is, only the upper sides of the transmission gates turn on.) The decoded column address signals on the nodes N5 through N8 are transmitted to the nodes N9 through N12 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected in response to the column address signals AY0 and AY0B. For example, when the column address signal AY0B is in the H level, the inverter INV141 outputs the normal column line selection signal having the H level to the normal column line CL0. As a result, the transmission gate (not shown in the figure), which has the control terminal connected to the normal column line CL0, is in an active state and the data stored in the memory cell (not shown in the figure) which is connected to the transmission gate, is transferred to the data line through the activated transmission gate.

The operation for selecting the normal column lines CL1 through CL7 is the same as that for selecting the normal column line CL0.

As explained above, only the normal column lines CL0 through CL7 are used in this case where none of the fuses have been cut because the upper side transmission gates are activated. (The redundant column lines RCL0 and RCL1 are not used in this case because the lower side transmission gates are not activated.) That is, this operation indicates that the semiconductor memory device does not have any defective memory cells.

Case 2: Fuse F01 Has Been Cut

Figure 4B:
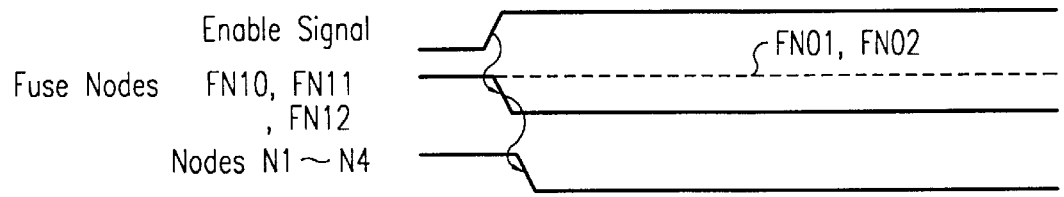

FIG. 4(B) is a timing chart showing an operation of the present invention in the case where the fuse F01 has been cut. That is, in this case, the redundant column lines RCL0 and RCL1 are used.

When the enable signal is in the L level, the state of the memory device is not in the data reading mode or the data writing mode. Therefore, the fuse drivers 211-0, 211-1 output the H level in this period. The fuse node clamping circuits 212-0 and 212-1 output the H level. Therefore, all the fuse nodes FN01 through FN12 are in the H level in this period.

When the enable signal is changed from the L level to the H level, the state of the memory device changes to the data reading mode or the data writing mode. The fuse nodes F01 and F02 are not driven by the fuse driver 211-0 because the fuse F01 has been cut. The potential level on the fuse nodes FN01, FN02 are still in the H level and are clamped by the fuse node clamping circuit 212-0.

Since all the input terminals of each NAND circuits NAND1 through NAND4 receive the H level, the nodes N1 through N4 are in the L level. So, the transmission gates T2, T4, T6 and T8 turn on and the transmission gates T1, T3, T5 and T7 turn off. (That is, only the lower sides of the transmission gates turn on.) The decoded column address signals on the nodes N5 through N8 are transmitted to the nodes N10 through N13 (not N9) respectively. If the column decoder 120 decodes the column address signal AYi and outputs the decoded column address signal having the L level to the node N5, the column decoder output switching circuit 130 outputs the signal has the H level to the node N10.

Therefore, one of the normal column lines CL2 and CL3 is selected instead of the normal column lines CL0 and CL1. For example, when the column address signal AY0B is in the H level, the inverter INV143 outputs the normal column line selection signal having the H level to the normal column line CL2. As a result, the transmission gate (not shown in the figure), which has the control terminal connected to the normal column line CL2, is in an active state and the data stored in the memory cell (not shown in the figure) which is connected to the transmission gate, is transferred to the data line through the activated transmission gate.

The operation for selecting the normal column lines CL3 through CL7 is the same as that for selecting the normal column line CL2.

If the column decoder 120 decodes the column address signal AYi and outputs the decoded column address signal having the L level to the node N8, the column decoder output switching circuit 130 outputs the signal has the H level to the node N13.

Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL0 and CL1 are not used and the redundant column lines RCL0 and RCL1 are used in this case where the fuse F01 has been cut. This is because the memory cell that is selected by one of the normal column lines CL0 and CL1 has a defect. That is, this operation indicates that the redundancy memory cell is substituted for the defective memory cell.

Case 3: Fuses F01 and F11 Have Been Cut

Figure 4C:
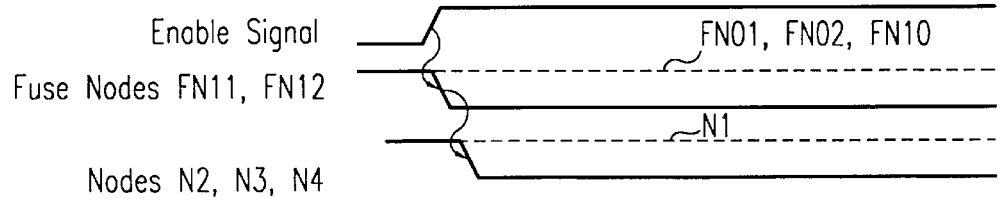

FIG. 4(C) is a timing chart showing an operation of the present invention in the case where the fuses F01 and F11 have been cut. That is, in this case, the redundant column lines RCL0 and RCL1 are used.

When the enable signal is in the L level, the state of the memory device is not in the data reading mode or the data writing mode. Therefore, the fuse drivers 211-0, 211-1 output the H level in this period. The fuse node clamping circuits 212-0 and 212-1 output the H level. Therefore, all the fuse nodes FN01 through FN12 are in the H level in this period.

When the enable signal is changed from the L level to the H level, the state of the memory device changes to the data reading mode or the data writing mode. The fuse nodes FN01, FN02 and FN10 are not driven by the fuse drivers 211-0, 211-1 because the fuses F01 and F11 have been cut. The fuse nodes FN11, FN12 are driven by the fuse driver 211-1. The potential level on these fuse nodes FN01, FN02 and FN10 are still in the H level and are clamped by the fuse node clamping circuits 212-0 and 212-1. The fuse nodes FN11, FN12 are in the L level.

Since all the input terminals of each NAND circuits NAND2 through NAND4 receive the H level and one of the input terminals of NAND circuit NAND1 receives the L level, the node N1 is in the H level and the nodes N2 through N4 are in the L level. So, the transmission gates T1, T4, T6 and T8 turn on and the transmission gates T2, T3, T5 and T7 turn off.

The decoded column address signal on the node N5 is transmitted to the node N9. The decoded column address signals on the nodes N6 through N8 are transmitted to the nodes N11 through N13 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected. For example, when the column address signal AY0B is in the H level, the inverter INV141 outputs the normal column line selection signal having the H level to the normal column line CL0.

If the column decoder 120 decodes the column address signal AYi and outputs the decoded column address signal having the L level to the node N6, the column decoder output switching circuit 130 outputs the signal has the H level to the node N11. Therefore, one of the normal column lines CL4 and CL5 is selected instead of the normal column lines CL2 and CL3. For example, when the column address signal AY0B is in the H level, the inverter INV145 outputs the normal column line selection signal having the H level to the normal column line CL4.

If the column decoder 120 decodes the column address signal AYi and outputs the decoded column address signal has the L level to the node N8, the column decoder output switching circuit 130 outputs the signal having the H level to the node N13. Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL2 and CL3 are not used and the redundant column lines RCL0 and RCL1 are used in this case where the fuses F01 and F11 have been cut. This is because the memory cell that is selected by one of the normal column lines CL2 and CL3 has a defect. That is, this operation indicates that the redundant memory cell is substituted for the defective memory cell.

If the memory cell associated with the normal column lines CL4 and CL5 has a defect, the defective memory cell can be replaced with redundant memory cell by cutting the fuses F02, F11. If a memory cell associated with the normal column lines CL6 and CL7 has a defect, the defective memory cell can be replaced with the redundant memory cell by cutting the fuses F02, F12.

As mentioned above, the semiconductor memory device of the second preferred embodiment has the same advantages of the first preferred embodiment. Furthermore, compared with the first preferred embodiment, the second preferred embodiment has an advantage in that it may reduce the number of fuses which must be cut when a memory cell associated with the normal column lines CL0, CL1 has the defect. That is, it is required to cut only one fuse (fuse F01) in this case.

Third Embodiment

A semiconductor memory device according to a third preferred embodiment of the present invention will be explained hereinafter in detail with reference to FIG. 5 and FIG. 6.

Figure 5:
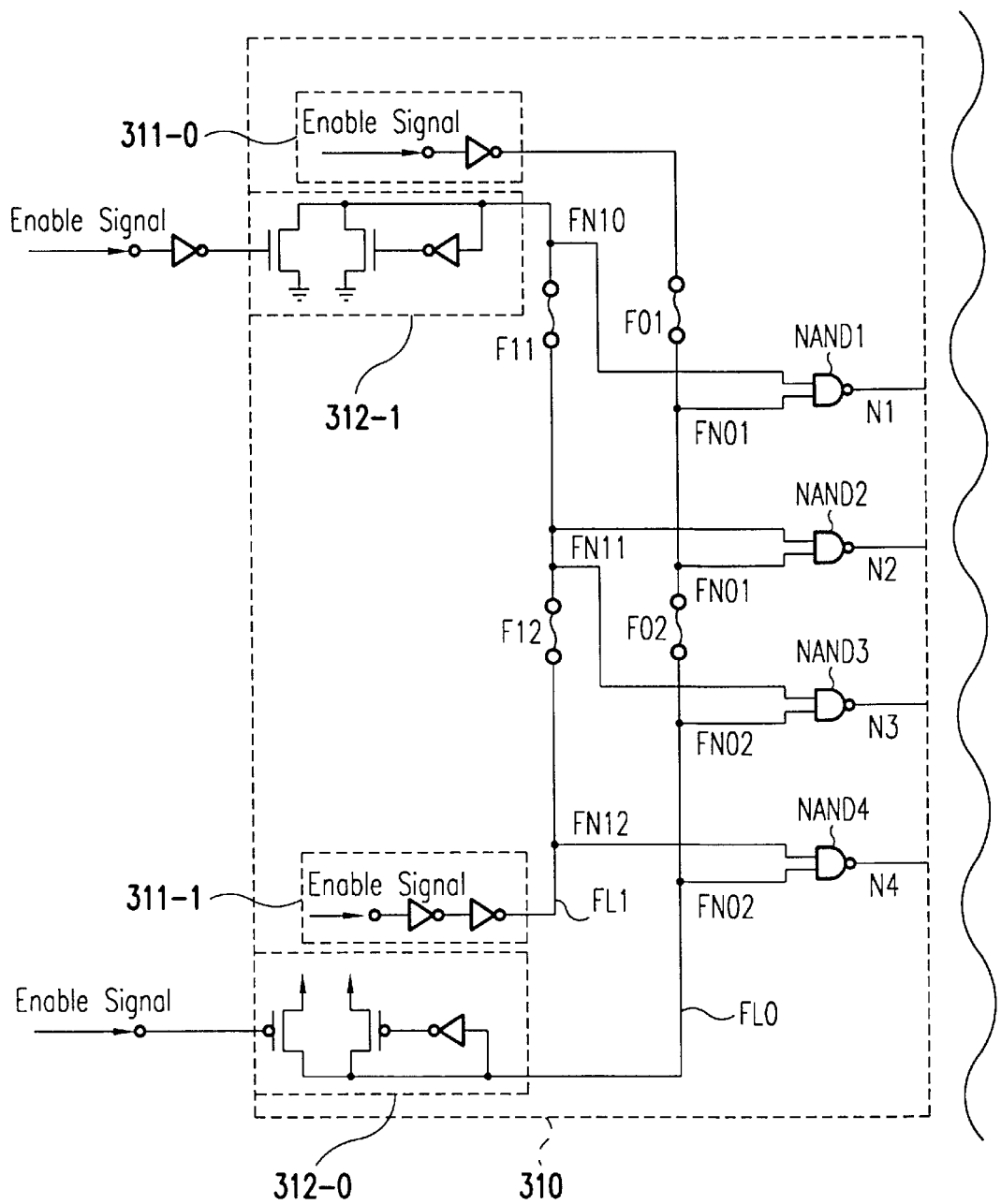
FIG. 5 is a circuit diagram showing a semiconductor memory device according to a third preferred embodiment.

FIG. 5 is a circuit diagram showing a semiconductor memory device according to the third preferred embodiment of the present invention. The difference between the third embodiment and the second embodiment resides in the circuit scheme of the redundant fuse circuit 310. The redundant fuse circuit 310 is a variation of the redundant circuit 210. The diagrams of the column decoder 120, column decoder output switching circuit 130 and the column driver 140 are omitted from FIG. 5.

One feature of the third embodiment is that a fuse clamping circuit 312-1 has NMOS transistors instead of the PMOS transistors and a fuse driver 311-1 has an even number of inverters as illustrated in FIG. 5. That is, the fuse clamping circuit 312-1 and the fuse driver 311-1 output the L level to the fuse wiring path FL1 when the semiconductor memory device is neither the reading mode nor the writing mode.

Furthermore, another feature of the third embodiment is that each of the input terminals of NAND circuits NAND1 through NAND4 are directly connected to the fuse wiring paths FL0, FL1 respectively as illustrated in FIG. 5.

The redundant fuse circuit 310 has the first fuse wiring path FL0 and the second fuse wiring path FL1. The first fuse wiring path FL0 includes fuses F01 and F02 which are connected in series. The second fuse wiring path FL1 includes fuses F11 and F12 which are connected in series. These fuses can be cut using a laser beam.

The redundant fuse circuit 310 also has fuse drivers 311-0, 311-1 and first and second fuse node clamping circuits 312-0, 312-1.

The fuse driver 311-0 and the fuse node clamping circuit 312-0 have the same elements as the fuse driver and the fuse node clamping circuit of the second embodiment. The fuse driver 311-1 has two inverters and the fuse node clamping circuit 312-1 has one inverter and two NMOS transistors.

The redundant fuse circuit 310 further has NAND circuits NAND1 to NAND4. The NAND1 has a first input terminal connected to the fuse node FN01, a second input terminal connected to the fuse node FN10 and an output terminal connected to the node N1. The NAND2 has a first input terminal connected to the fuse node FN01, a second input terminal connected to the fuse node FN11 and an output terminal connected to the node N2. The NAND3 has a first input terminal connected to the fuse node FN02, a second input terminal connected to the fuse node FN11 and an output terminal connected to the node N3. The NAND4 has a first input terminal connected to the fuse node FN02, a second input terminal connected to the fuse node FN12 and an output terminal connected to the node N4. The nodes N1 through N4 are output terminals of the redundant fuse circuit 310. The signals on nodes N1 through N4 are transmitted to the column decoder output switching circuit 130.

Next, the operation of the semiconductor memory device as shown in FIG. 5 will be explained with reference to FIG. 6(A) through FIG. 6(C).

Case 1: No Fuses Have Been Cut

Figure 6A:
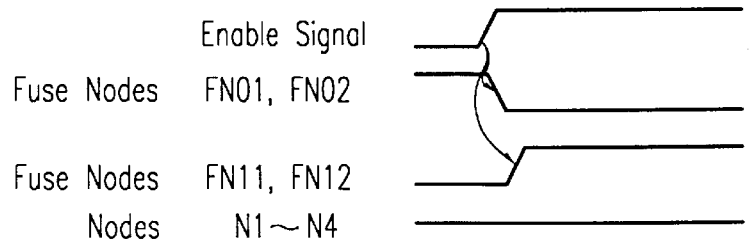
FIG. 6(a) to FIG. 6(c) are timing charts showing an operation of the third preferred embodiment.

FIG. 6(A) is a timing chart showing an operation of the present invention in the case where none of the fuses have been cut. That is, in this case, the redundant column lines RCL0 and RCL1 are not used.

When the enable signal is in the L level, the state of the memory device is not in the data reading mode or the data writing mode. Therefore, the fuse driver 311-0 outputs the H level in this period. The fuse node clamping circuit 312-0 outputs the H level. The fuse driver 311-1 outputs the L level in this period. The fuse node clamping circuit 312-1 outputs the L level. As a result, the nodes N1 through N4 are in the H level.

When the enable signal is changed from the L level to the H level, the state of the memory device changes to the data reading mode or the data writing mode.

The fuse wiring path FL0 is driven by the fuse driver 311-0 to the L level and the fuse wiring path FL1 is driven by the fuse driver 311-1 to the H level. (That is, the fuse nodes FN01, FN02 are in the H level and the FN10, FN11 and FN12 are in the L level.)

Since at least one of the input terminals of each NAND circuits NAND1 through NAND4 receive the L level, the nodes N1 through N4 are in the H level. So, the transmission gates T1, T3, T5 and T7 turn on and the transmission gates T2, T4, T6 and T8 turn off. (That is, only the upper side of the transmission gates turn on.) The decoded column address signals on the nodes N5 through N8 are transmitted to the nodes N9 through N12 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected in response to the column address signals AY0 and AY0B. For example, when the column address signal AY0B is in the H level, the inverter INV141 outputs the normal column line selection signal having the H level to the normal column line CL0. As a result, the transmission gate (not shown in the figure), which has the control terminal connected to the normal column line CL0, is in an active state and the data stored in the memory cell (not shown in the figure) which is connected to the transmission gate, is transferred to the data line through the activated transmission gate.

The operation for selecting the normal column lines CL1 through CL7 is the same as that for selecting the normal column line CL0.

As explained above, only the normal column lines CL0 through CL7 are used in this case where none of the fuses have been cut because the upper side transmission gates are activated. (The redundant column lines RCL0 and RCL1 are not used in this case because the lower side transmission gates are not activated.) That is, this operation indicates that the semiconductor memory device does not have any defective memory cells.

Case 2: Fuse F01 Has Been Cut

Figure 6B:
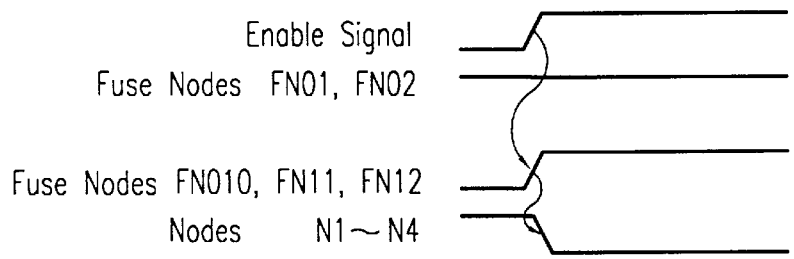

FIG. 6(B) is a timing chart showing an operation of the present invention in the case where the fuse F01 has been cut. That is, in this case, the redundant column lines RCL0 and RCL1 are used.

When the enable signal is in the L level, the state of the memory device is not in the data reading mode or the data writing mode. Therefore, the fuse driver 311-0 and the fuse node clamping circuit 312-0 output the H level in this period. The fuse driver 311-1 and the fuse clamping circuit 312-1 output the L level in this period. Therefore, the fuse nodes FN01, F02 are in the H level and the fuse nodes F10, FN11 and FN12 are in the L level in this period.

When the enable signal is changed from the L level to the H level, the state of the memory device changes to the data reading mode or the data writing mode. The fuse nodes FN01 and FN02 are not driven by the fuse driver 311-0 because the fuse F01 has been cut. The potential level on the fuse nodes FN01, FN02 are still in the H level and are clamped by the fuse node clamping circuit 312-0. On the contrary, the fuse wiring path FL1 is driven by the fuse driver 311-1 to the H level. So, the potential level on the fuse nodes FN10, FN11 and FN12 are in the H level.

Since all the input terminals of each NAND circuits NAND1 through NAND4 receive the H level, the nodes N1 through N4 are in the L level. So, the transmission gates T2, T4, T6 and T8 turn on and the transmission gates T1, T3, T5 and T7 turn off. (That is, only the lower side of the transmission gates turn on.) The decoded column address signals on the nodes N5 through N8 are transmitted to the nodes N10 through N13 (not N9) respectively. If the column decoder 120 decodes the column address signal AYi and outputs the decoded column address signal having the L level to the node N5, the column decoder output switching circuit 130 outputs the signal having the H level to the node N10.

Therefore, one of the normal column lines CL2 and CL3 is selected instead of the normal column lines CL0 and CL1. For example, when the column address signal AY0B is in the H level, the inverter INV143 outputs a normal column line selection signal having the H level to the normal column line CL2. As a result, the transmission gate (not shown in the figure), which has the control terminal connected to the normal column line CL2, is in an active state and the data stored in the memory cell (not shown in the figure) which is connected to the transmission gate, is transferred to the data line through the activated transmission gate.

The operation for selecting the normal column lines CL3 through CL7 is the same as that for selecting the normal column line CL2.

If the column decoder 120 decodes the column address signal AYi and outputs the decoded column address signal having the L level to the node N8, the column decoder output switching circuit 130 outputs the signal having the H level to the node N13.

Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL0 and CL1 are not used and the redundant column lines RCL0 and RCL1 are used in this case where the fuse F01 has been cut. This is because the memory cell that is selected by one of the normal column lines CL0 and CL1 has a defect. That is, this operation indicates that the redundancy memory cell is substituted for the defective memory cell.

Case 3: Fuses F01 and F11 Have Been Cut

Figure 6C:
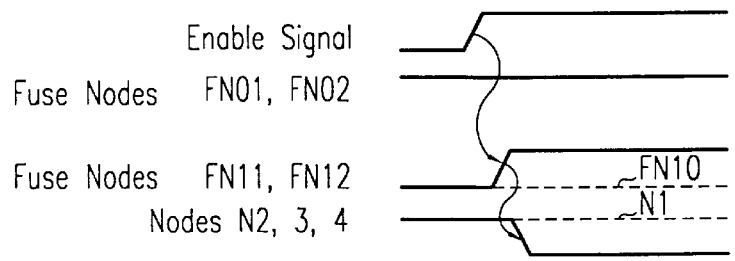

FIG. 6(C) is a timing chart showing an operation of the present invention in the case where the fuses F01 and F11 have been cut. That is, in this case, the redundant column lines RCL0 and RCL1 are used.

When the enable signal is in the L level, the state of the memory device is not in the data reading mode or the data writing mode. Therefore, the fuse driver 311-0 and the fuse node clamping circuit 312-0 output the H level in this period. The fuse driver 311-1 and the fuse clamping circuit 312-1 output the L level in this period. Therefore, the fuse nodes FN01, F02 are in the H level and the fuse nodes F10, FN11 and FN12 are in the L level in this period.

When the enable signal is changed from the L level to the H level, the state of the memory device changes to the data reading mode or the data writing mode. The fuse nodes FN01 and FN02 are not driven by the fuse driver 311-0 because the fuse F01 has been cut. The potential level on the fuse nodes FN01, FN02 are still in the H level and are clamped by the fuse node clamping circuit 312-0. The fuse nodes FN11 and FN12 are driven by the fuse driver 311-1 to the H level. So, the potential level on the fuse nodes FN11, FN12 are in the H level.

Since all the input terminals of each NAND circuits NAND2 through NAND4 receive the H level and one of the input terminals of NAND circuit NAND1 receives the L level, the node N1 is in the H level and the nodes N2 through N4 are in the L level. So, the transmission gates T1, T4, T6 and T8 turn on and the transmission gates T2, T3, T5 and T7 turn off.

The decoded column address signal on the node N5 is transmitted to the node N9. The decoded column address signals on the nodes N6 through N8 are transmitted to the nodes N11 through N13 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected. For example, when the column address signal AY0B is in the H level, the inverter INV141 outputs the normal column line selection signal having the H level to the normal column line CL0.

If the column decoder 120 decodes the column address signal AYi and outputs the decoded column address signal having the L level to the node N6, the column decoder output switching circuit 130 outputs the signal having the H level to the node N11. Therefore, one of the normal column lines CL4 and CL5 is selected instead of the normal column lines CL2 and CL3. For example, when the column address signal AY0B is in the H level, the inverter INV145 outputs the normal column line selection signal having the H level to the normal column line CL4.

If the column decoder 120 decodes the column address signal AYi and outputs the decoded column address signal having the L level to the node N8, the column decoder output switching circuit 130 outputs the signal having the H level to the node N13. Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL2 and CL3 are not used and the redundant column lines RCL0 and RCL1 are used in this case where the fuses F01 and F11 have been cut because the memory cell that is to be selected by one of the normal column lines CL2 and CL3 has a defect. That is, this operation indicates that the semiconductor memory device replaces the defective memory cell with the redundant memory cell.

If the memory cell associated with the normal column lines CL4 and CL5 has a defect, the defective memory cell can be replaced with the redundant memory cell by cutting the fuse F02. If a memory cell associated with the normal column lines CL6 and CL7 has a defect, the defective memory cell can be replaced with the redundant memory cell by cutting the fuses F02, F12.

As mentioned above, the semiconductor memory device of the third preferred embodiment has the same advantages of the second preferred embodiment. Furthermore, compared with the second preferred embodiment, the third preferred embodiment has an advantage in that it may reduce the circuit area as a whole. That is, it is not necessary to provide the inverters such as INV1 through INV4 of the second embodiment.

Fourth Embodiment

A semiconductor memory device according to a fourth preferred embodiment of the present invention will be explained hereinafter in detail with reference to FIG. 7 and FIG. 8.

Figure 7:
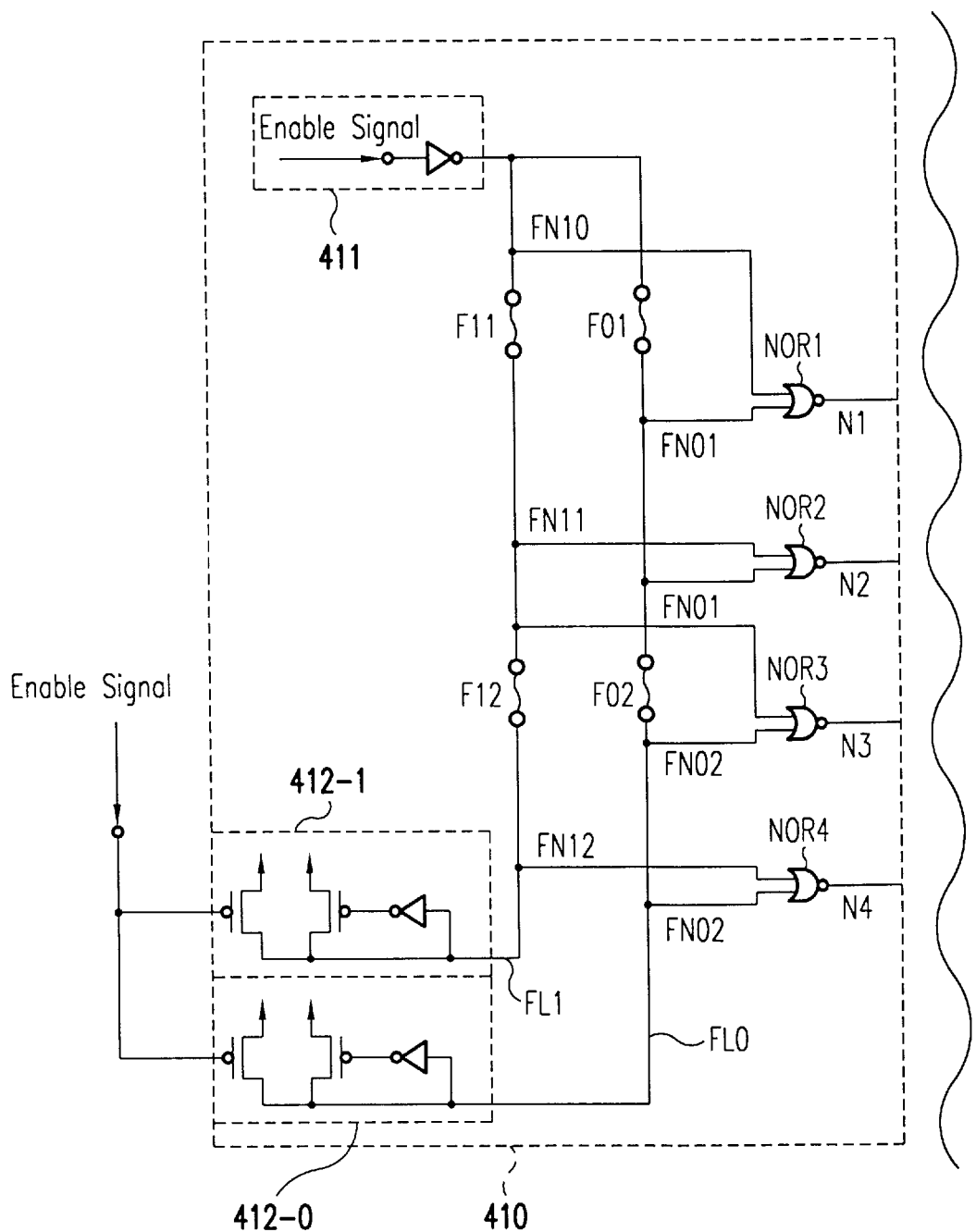
FIG. 7 is a circuit diagram showing a semiconductor memory device according to a fourth preferred embodiment.

FIG. 7 is a circuit diagram showing a semiconductor memory device according to the fourth preferred embodiment of the present invention. The difference between the fourth embodiment and the first embodiment resides in the circuit scheme of the redundant fuse circuit 410. The redundant fuse circuit 410 is a variation of the redundant circuit 110. The column decoder 120, the column decoder output switching circuit 130 and the column driver 140 are omitted from FIG. 7.

One feature of the fourth embodiment is that the redundant fuse circuit 410 has NOR circuits NOR1 through NOR4 as illustrated in FIG. 7.

The redundant fuse circuit 410 has the first fuse wiring path FL0 and the second fuse wiring path FL1. The first fuse wiring path FL0 includes fuses F01 and F02 which are connected in series. The second fuse wiring path FL1 includes fuses F11 and F12 which are connected in series. These fuses can be cut using a laser beam.

The redundant fuse circuit 410 also has a fuse driver 411 and first and second fuse node clamping circuits 412-0, 412-1.

The fuse driver 411 and the fuse node clamping circuits 412-0, 412-1 have the same elements as those of the fuse driver and the fuse node clamping circuit of the first embodiment.

The redundant fuse circuit 410 further has NOR circuits NOR1 to NOR4. The NOR1 has a first input terminal connected to the fuse node FN01, a second input terminal connected to the fuse node FN10 and an output terminal connected to the node N1. The NOR2 has a first input terminal connected to the fuse node FN01, a second input terminal connected to the fuse node FN11 and an output terminal connected to the node N2. The NOR 3 has a first input terminal connected to the fuse node FN02, a second input terminal connected to the fuse node FN11 and an output terminal connected to the node N3. The NOR4 has a first input terminal connected to the fuse node FN02, a second input terminal connected to the fuse node FN12 and an output terminal connected to the node N4. The nodes N1 through N4 are output terminals of the redundant fuse circuit 410. The signals on nodes N1 through N4 are transmitted to the column decoder output switching circuit 130.

Next, the operation of the semiconductor memory device as shown in FIG. 7 will be explained with reference to FIG. 8(A) through FIG. 8(C).

Case 1: No Fuses Have Been Cut

Figure 8A:
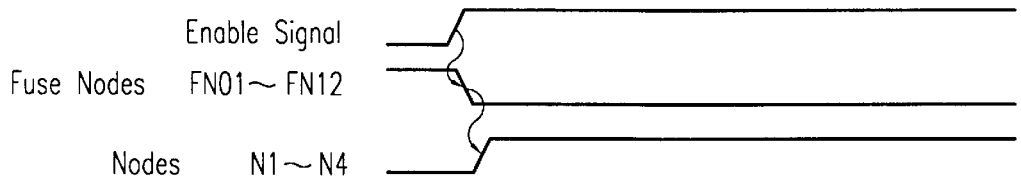
FIG. 8(a) to FIG. 8(c) are timing charts showing an operation of the fourth preferred embodiment.

FIG. 8(A) is a timing chart showing an operation of the present invention in the case where none of the fuses have been cut. That is, in this case, the redundant column lines RCL0 and RCL1 are not used.

When the enable signal is in the L level, the state of the memory device is not in the data reading mode or the data writing mode. Therefore, the fuse driver 411 outputs the H level in this period. The fuse node clamping circuit 412-0, 412-1 outputs the H level. As a result, the nodes N1 through N4 are in the L level.

When the enable signal is changed from the L level to the H level, the state of the memory device changes to the data reading mode or the data writing mode.

The fuse wiring paths FL0, FL1 are driven by the fuse driver 411 to the L level. (That is, the fuse nodes FN01, FN02, FN10, FN11 and FN 12 are in the L level.)

Since all the input terminals of each NOR circuits NOR1 through NOR4 receive the L level, the nodes N1 through N4 are in the H level. So, the transmission gates T1, T3, T5 and T7 turn on and the transmission gates T2, T4, T6 and T8 turn off. (That is, only the upper side of the transmission gates turn on.) The decoded column signals on the nodes N5 through N8 are transmitted to the nodes N9 through N12 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected in response to the column address signals AY0 and AY0B. For example, when the column address signal AY0B is in the H level, the inverter INV141 outputs the normal column line selection signal having the H level to the normal column line CL0. As a result, the transmission gate (not shown in the figure), which has the control terminal connected to the normal column line CL0, is in an active state and the data stored in the memory cell (not shown in the figure) which is connected to the transmission gate, is transferred to the data line through the activated transmission gate.

The operation for selecting the normal column lines CL1 through CL7 is the same as that of selecting the normal column line CL0.

As explained above, only the normal column lines CL0 through CL7 are used in this case where none of the fuses have been cut because the upper side transmission gates are activated. (The redundant column lines RCL0 and RCL1 are not used in this case because the lower side transmission gates are not activated.) That is, this operation indicates that the semiconductor memory device does not have any defective memory cells.

Case 2: Fuse F01 Has Been Cut

Figure 8B:
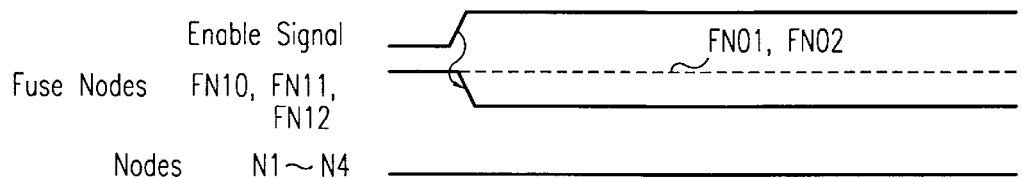

FIG. 8(B) is a timing chart showing an operation of the present invention in the case where the fuse F01 has been cut. That is, in this case, the redundant column lines RCL0 and RCL1 are used.

When the enable signal is in the L level, the state of the memory device is not in the data reading mode or the data writing mode. Therefore, the fuse driver 411 and the fuse node clamping circuits 412-0, 412-1 output the H level in this period.

Therefore, the fuse nodes FN01, FN02, FN10, FN11 and FN12 are in the H level in this period.

When the enable signal is changed from the L level to the H level, the state of the memory device changes to the data reading mode or the data writing mode. The fuse nodes FN01 and FN02 are not driven by the fuse driver 411 because the fuse F01 has been cut. The potential level on the fuse nodes FN01, FN02 are still in the H level and are clamped by the fuse node clamping circuit 412-0. On the contrary, the fuse wiring path FL1 is driven by the fuse driver 411 to the L level. So, the potential level on the fuse nodes FN10, FN11 and FN12 are in the L level.

Since one of the input terminals of each NOR circuits NOR1 through NOR 4 receive the H level, the nodes N1 through N4 are in the L level. So, the transmission gates T2, T4, T6 and T8 turn on and the transmission gates T1, T3, T5 and T7 turn off. (That is, only the lower side of the transmission gates turn on.) The decoded column address signals on the nodes N5 through N8 are transmitted to the nodes N10 through N13 (not N9) respectively. If the column decoder 120 decodes the column address signal AYi and outputs the decoded column address signal having the L level to the node N5, the column decoder output switching circuit 130 outputs the signal having the H level to the node N10.

Therefore, one of the normal column lines CL2 and CL3 is selected instead of the normal column lines CL0 and CL1. For example, when the column address signal AY0B is in the H level, the inverter INV143 outputs the normal column line selection signal having the H level to the normal column line CL2. As a result, the transmission gate (not shown in the figure), which has the control terminal connected to the normal column line CL2, is in an active state and the data stored in the memory cell (not shown in the figure) which is connected to the transmission gate, is transferred to the data line through the activated transmission gate.

The operation for selecting the normal column lines CL3 through CL7 is the same as that of selecting the normal column line CL2.

If the column decoder 120 decodes the column address signal AYi and outputs the decoded column address signal having the L level to the node N8, the column decoder output switching circuit 130 outputs the signal having the H level to the node N13.

Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL0 and CL1 are not used and the redundant column lines RCL0 and RCL1 are used in this case where the fuse F01 has been cut because the memory cell that is selected by one of the normal column lines CL0 and CL1 has a defect. That is, this operation indicates that the redundancy memory cell is substituted for the defective memory cell.

Case 3: Fuse F11 Has Been Cut

Figure 8C:
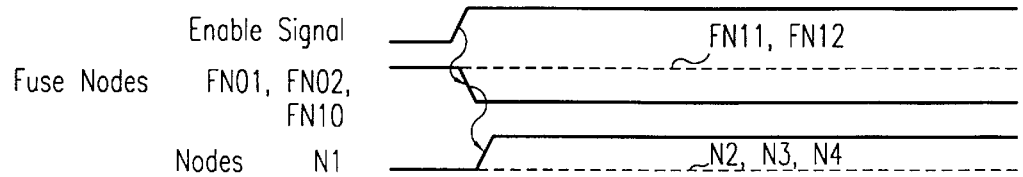

FIG. 8(C) is a timing chart showing an operation of the present invention in the case where the fuses F11 has been cut. That is, in this case, the redundant column lines RCL0 and RCL1 are used.

When the enable signal is in the L level, the state of the memory device is not in the data reading mode or the data writing mode. Therefore, the fuse driver 411 and the fuse node clamping circuits 412-0, 412-1 output the H level in this period. Therefore, the fuse nodes FN01, FN02, FN10, FN11 and FN12 are in the H level.

When the enable signal is changed from the L level to the H level, the state of the memory device changes to the data reading mode or the data writing mode. The fuse wiring path FL0 is driven by the fuse driver 411 to the L level. So, the potential level on the fuse nodes FN01, FN02 are in the L level. The fuse nodes FN11 and FN12 are not driven by the fuse driver 411 because the fuse F11 has been cut. The potential level on the fuse nodes FN11, FN12 are still in the H level and are clamped by the fuse node clamping circuit 412-1.

Since one of the input terminals of each NOR circuits NOR2 through NOR4 receive the H level and the input terminals of NOR circuit NOR1 receive the L level, the node N1 is in the H level and the nodes N2 through N4 are in the L level. So, the transmission gates T1, T4, T6 and T8 turn on and the transmission gates T2, T3, T5 and T7 turn off.

The decoded column address signal on the node N5 is transmitted to the node N9. The decoded column address signals on the nodes N6 through N8 are transmitted to the nodes N11 through N13 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected. For example, when the column address signal AY0B is in the H level, the inverter INV141 outputs the normal column line selection signal having the H level to the normal column line CL0.

If the column decoder 120 decodes the column address signal AYi and outputs the decoded column address signal having the L level to the node N6, the column decoder output switching circuit 130 outputs the signal having the H level to the node N11. Therefore, one of the normal column lines CL4 and CL5 is selected instead of the normal column lines CL2 and CL3. For example, when the column address signal AY0B is in the H level, the inverter INV145 outputs the normal column line selection signal having the H level to the normal column line CL4.

If the column decoder 120 decodes the column address signal AYi and outputs the decoded column address signal having the L level to the node N8, the column decoder output switching circuit 130 outputs the signal having the H level to the node N13. Therefore, one of the redundant column lines RCL0 and RCL1 is selected instead of the normal column lines CL6 and CL7. For example, when the column address signal AY0B is in the H level, the inverter INV149 outputs a redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL2 and CL3 are not used and the redundant column lines RCL0 and RCL1 are used in this case where the fuses F11 has been cut because the memory cell that is to be selected by one of the normal column lines CL2 and CL3 has a defect. That is, this operation indicates that the semiconductor memory device replaces the defective memory cell with the redundant memory cell.

If a memory cell associated with the normal column lines CL4 and CL5 has a defect, the defective memory cell can be replaced with the redundant memory cell by cutting the fuse F02. If a memory cell associated with the normal column lines CL6 and CL7 has a defect, the defective memory cell can be replaced with the redundant memory cell by cutting the fuse F12.

As mentioned above, the semiconductor memory device of the fourth preferred embodiment has the same advantages of the first preferred embodiment. Furthermore, compared with the first preferred embodiment, the fourth preferred embodiment has an advantage in that it may minimize the cutting of fuses when the redundant column line is used.

Fifth Embodiment

A semiconductor memory device according to a fifth preferred embodiment of the present invention will be explained hereinafter in detail with reference to FIG. 9 and FIG. 10.

Figure 9:
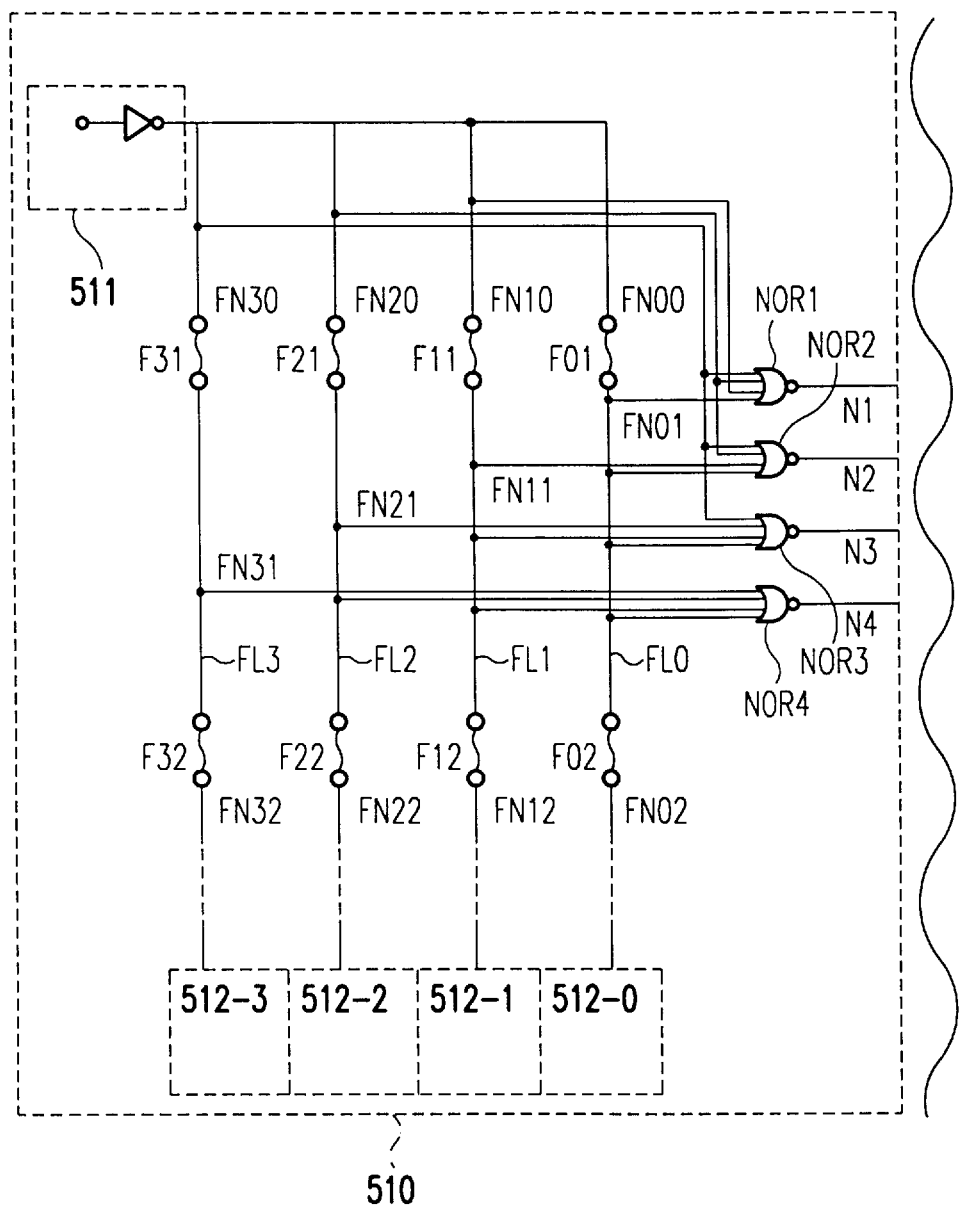
FIG. 9 is a circuit diagram showing a semiconductor memory device according to a fifth preferred embodiment.

FIG. 9 is a circuit diagram showing a semiconductor memory device according to the fifth preferred embodiment of the present invention. The difference between the fifth embodiment and the fourth embodiment resides in the circuit scheme with regard to the redundant fuse circuit 510. The redundant fuse circuit 510 is a variation of the redundant circuit 410. The column decoder 120, the column decoder output switching circuit 130 and the column driver 140 are omitted from FIG. 9.

As illustrated in FIG. 9, one feature of the fifth embodiment is that the number of the fuse wiring paths is increased, each of which is connected to the NOR circuits NOR1 through NOR 4, compared to the fourth embodiment. The circuit scheme of the lower portion below NOR4 is the same as the circuit scheme of the upper portion including NOR4. That is, there are other memory cell blocks below the NOR4. Accordingly, the circuit scheme of the lower portion and the explanation thereof are omitted from FIG. 9.

The redundant fuse circuit 510 has the first through the fourth fuse wiring paths FL0 to FL3. The first fuse wiring path FL0 includes fuses F01 and F02 which are connected in series through the fuse node FN01. The second fuse wiring path FL1 includes fuses F11 and F12 which are connected in series through the fuse node FN11. The third fuse wiring path FL2 includes fuses F21 and F22 which are connected in series through the fuse node FN21. The fourth fuse wiring path FL3 includes fuses F31 and F32 which are connected in series through the fuse node FN31. These fuses can be cut using a laser beam.

The redundant fuse circuit 510 also has fuse driver 511 and first through fourth fuse node clamping circuits 512-0, 512-1, 512-2 and 512-3.

The fuse driver 511 and the fuse node clamping circuits 512-0, 512-1, 512-2 and 512-3 have the same elements as those of the fuse driver and the fuse node clamping circuit of the fourth embodiment.

The redundant fuse circuit 510 further has NOR circuits NOR1 to NOR4. The NOR1 has a first input terminal connected to the fuse node FN01, a second input terminal connected to the fuse node FN10, a third input terminal connected to the fuse node FN20, a fourth input terminal connected to the fuse node FN30 and an output terminal connected to the node N1. The NOR2 has a first input terminal connected to the fuse node FN01, a second input terminal connected to the fuse node FN11, a third input terminal connected to the fuse node FN20, a fourth input terminal connected to the fuse node FN30 and an output terminal connected to the node N2. The NOR3 has a first input terminal connected to the fuse node FN01, a second input terminal connected to the fuse node FN11, a third input terminal connected to the fuse node FN21, a fourth input terminal connected to the fuse node FN30 and an output terminal connected to the node N3. The NOR4 has a first input terminal connected to the fuse node FN01, a second input terminal connected to the fuse node FN11, a third input terminal connected to the fuse node FN21, a fourth input terminal connected to the fuse node FN31 and an output terminal connected to the node N4.

The nodes N1 through N4 are output terminals of the redundant fuse circuit 510. The signals on the nodes N1 through N4 are transmitted to the column decoder output switching circuit 130.

Next, the operation of the semiconductor memory device as shown in FIG. 9 will be explained with reference to FIG. 10(A) through FIG. 10(C).

Case 1: No Fuses Have Been Cut

Figure 10A:
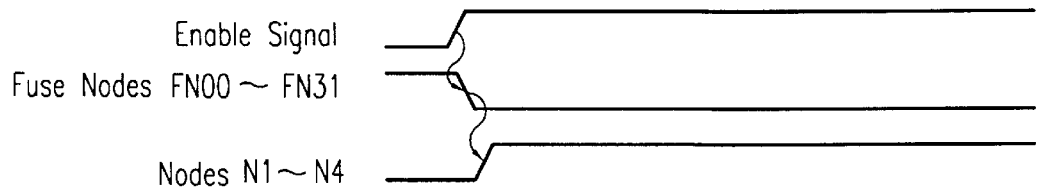
FIG. 10(a) to FIG. 10(c) are timing charts showing an operation of the fifth preferred embodiment.

FIG. 10(A) is a timing chart showing an operation of the present invention in the case where none of the fuses have been cut. That is, in this case, the redundant column lines RCL0 and RCL1 are not used.

When the enable signal is in the L level, the state of the memory device is not in the data reading mode or a data writing mode. Therefore, the fuse driver 511 outputs the H level in this period. The fuse node clamping circuits 512-0 to 512-3 output the H level. As a result, the nodes N1 through N4 are in the L level.

When the enable signal is changed from the L level to the H level, the state of the memory device changes to the data reading mode or the data writing mode.

The fuse wiring paths FL0, FL1, FL2 and FL3 are driven by the fuse driver 511 to the L level. (That is, all the fuse nodes FN00 to FN 32 are in the L level.)

Since all the input terminals of each NOR circuits NOR1 through NOR4 receive the L level, the nodes N1 through N4 are in the H level. So, the transmission gates T1, T3, T5 and T7 turn on and the transmission gates T2, T4, T6 and T8 turn off. (That is, only the upper side of the transmission gates turn on.) The decoded column address signals on the nodes N5 through N8 are transmitted to the nodes N9 through N12 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 are selected in response to the column address signals AY0 and AY0B. For example, when the column address signal AY0B is in the H level, the inverter INV141 outputs the normal column line selection signal having the H level to the normal column line CL0. As a result, the transmission gate (not shown in the figure), which has the control terminal connected to the normal column line CL0, is in an active state and the data stored in the memory cell (not shown in the figure) which is connected to the transmission gate, is transferred to the data line through the activated transmission gate.

The operation for selecting the normal column lines CL1 through CL7 is the same as that of selecting the normal column line CL0.

As explained above, only the normal column lines CL0 through CL7 are used in this case where none of the fuses have been cut because the upper side transmission gates are activated. (The redundant column lines RCL0 and RCL1 are not used in this case because the lower side transmission gates are not activated.) That is, this operation indicates that the semiconductor memory device does not have any defective memory cells.

Case 2: Fuse F01 Has Been Cut

Figure 10B:
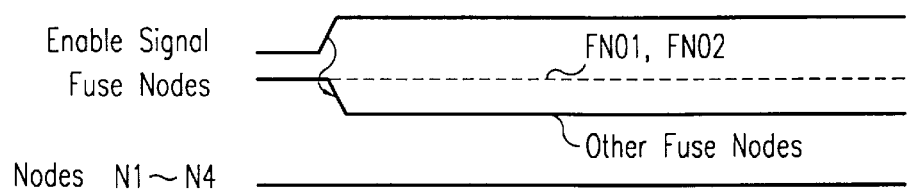

FIG. 10(B) is a timing chart showing an operation of the present invention in the case where the fuse F01 is cut. That is, in this case, the redundant column lines RCL0 and RCL1 are used.

When the enable signal is in the L level, the state of the memory device is not in the data reading mode or the data writing mode. Therefore, the fuse driver 511 and the fuse node clamping circuits 512-0 through 512-3 output the H level in this period. Therefore, all the fuse nodes FN00 through FN32 are in the H level in this period.

When the enable signal is changed from the L level to the H level, the state of the memory device changes to the data reading mode or the data writing mode. The fuse node FN01 is not driven by the fuse driver 511 because the fuse F01 has been cut. The potential level on the fuse node FN01 is still in the H level and is clamped by the fuse node clamping circuit 512-0. On the contrary, the fuse wiring paths FL1 through FL3 are driven by the fuse driver 511 to the L level. So, the potential levels on the fuse nodes FN10 trough FN32 are in the L level.

Since one of the input terminals of each NOR circuits NOR1 through NOR 4 receives the H level, the nodes N1 through N4 are in the L level. So, the transmission gates T2, T4, T6 and T8 turn on and the transmission gates T1, T3, T5 and T7 turn off. (That is, only the lower side of the transmission gates turn on.) The decoded column address signals on the nodes N5 through N8 are transmitted to the nodes N10 through N13 (not N9) respectively. If the column decoder 120 decodes the column address signal AYi and outputs the decoded column address signal having the L level to the node N5, the column decoder output switching circuit 130 outputs the signal having the H level to the node N10.

Therefore, one of the normal column lines CL2 and CL3 is selected instead of the normal column lines CL0 and CL1. For example, when the column address signal AY0B is in the H level, the inverter INV143 outputs the normal column line selection signal having the H level to the normal column line CL2. As a result, the transmission gate (not shown in the figure), which has the control terminal connected to the normal column line CL2, is in an active state and the data stored in the memory cell (not shown in the figure) which is connected to the transmission gate, is transferred to the data line through the activated transmission gate.

The operation for selecting the normal column lines CL3 through CL7 is the same as that of selecting the normal column line CL2.

If the column decoder 120 decodes the column address signal AYi and outputs the decoded column address signal having the L level to the node N8, the column decoder output switching circuit 130 outputs the signal having the H level to the node N13.

Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL0 and CL1 are not used and the redundant column lines RCL0 and RCL1 are used in this case where the fuse F01 has been cut because the memory cell that is selected by one of the normal column lines CL0 and CL1 has a defect. That is, this operation indicates that the redundancy memory cell is substituted for the defective memory cell.

Case 3: Fuse F21 Has Been Cut

Figure 10C:
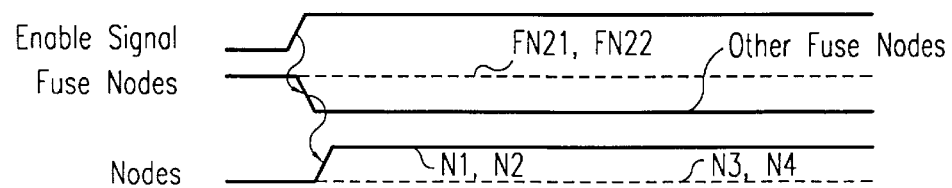

FIG. 10(C) is a timing chart showing an operation of the present invention in the case where the fuse F21 has been cut. That is, this case is also that the redundant column lines RCL0 and RCL1 are used.

When the enable signal is in the L level, the state of the memory device is not in the data reading mode or the data writing mode. Therefore, the fuse driver 511 and the fuse node clamping circuits 512-0 through 512-3 output the H level in this period. Therefore, the fuse nodes FN00 through FN32 are in the H level.

When the enable signal is changed from the L level to the H level, the state of the memory device changes to the data reading mode or the data writing mode. The fuse wiring paths FL0, FL1 and FL3 are driven by the fuse driver 511 to the L level. So, the potential level on the fuse nodes FN00, FN11 and FN31 are in the L level. On the contrary, the fuse node FN21 is not driven by the fuse driver 511 because the fuse F21 has been cut. The potential level on the node FN21 is still in the H level and is clamped by the fuse node clamping circuit 512-2.

Since one of the input terminals of each NOR circuits NOR3 and NOR4 receives the H level and the input terminals of NOR circuits NOR1 and NOR2 receive the L level, the nodes N1 and N2 are in the H level and the nodes N2 and N4 are in the L level. So, the transmission gates T1, T3, T6 and T8 turn on and the transmission gates T2, T4, T5 and T7 turn off.

The decoded column address signals on the nodes N5 and N6 are transmitted to the nodes N9 and N10 respectively. The decoded column address signals on the nodes N7 and N8 are transmitted to the nodes N12 and N13 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected. For example, when the column address signal AY0B is in the H level, the inverter INV141 outputs the normal column line selection signal having the H level to the normal column line CL0.

If the column decoder 120 decodes the column address signal AYi and outputs the decoded column address signal having the L level to the node N7, the column decoder output switching circuit 130 outputs the signal having the H level to the node N12. Therefore, one of the normal column lines CL6 and CL7 is selected instead of the normal column lines CL4 and CL5. For example, when the column address signal AY0B is in the H level, the inverter INV147 outputs the normal column line selection signal having the H level to the normal column line CL6.

If the column decoder 120 decodes the column address signal AYi and outputs the decoded column address signal having the L level to the node N8, the column decoder output switching circuit 130 outputs the signal having the H level to the node N13. Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL4 and CL5 are not used and the redundant column lines RCL0 and RCL1 are used in this case where the fuse F21 has been cut because the memory cell that is to be selected by one of the normal column lines CL4 and CL5 has a defect. That is, this operation indicates that the semiconductor memory device replaces the defective memory cell with the redundant memory cell.

If a memory cell associated with the normal column lines CL2 and CL3 has a defect, the defective memory cell can be replaced with the redundant memory cell by cutting the fuse F11. If a memory cell associated with the normal column lines CL6 and CL7 has a defect, the defective memory cell can be replaced with the redundant memory cell by cutting the fuse F31.

As mentioned above, the semiconductor memory device of the fifth preferred embodiment has an advantage in that it is easy to arrange the fuses because each of the fuse wiring paths has only one fuse per memory cell block for enabling a corresponding column line.

Sixth Embodiment

A semiconductor memory device according to a sixth preferred embodiment of the present invention will be explained hereinafter in detail with reference to FIG. 11 and FIG. 12.

Figure 11:
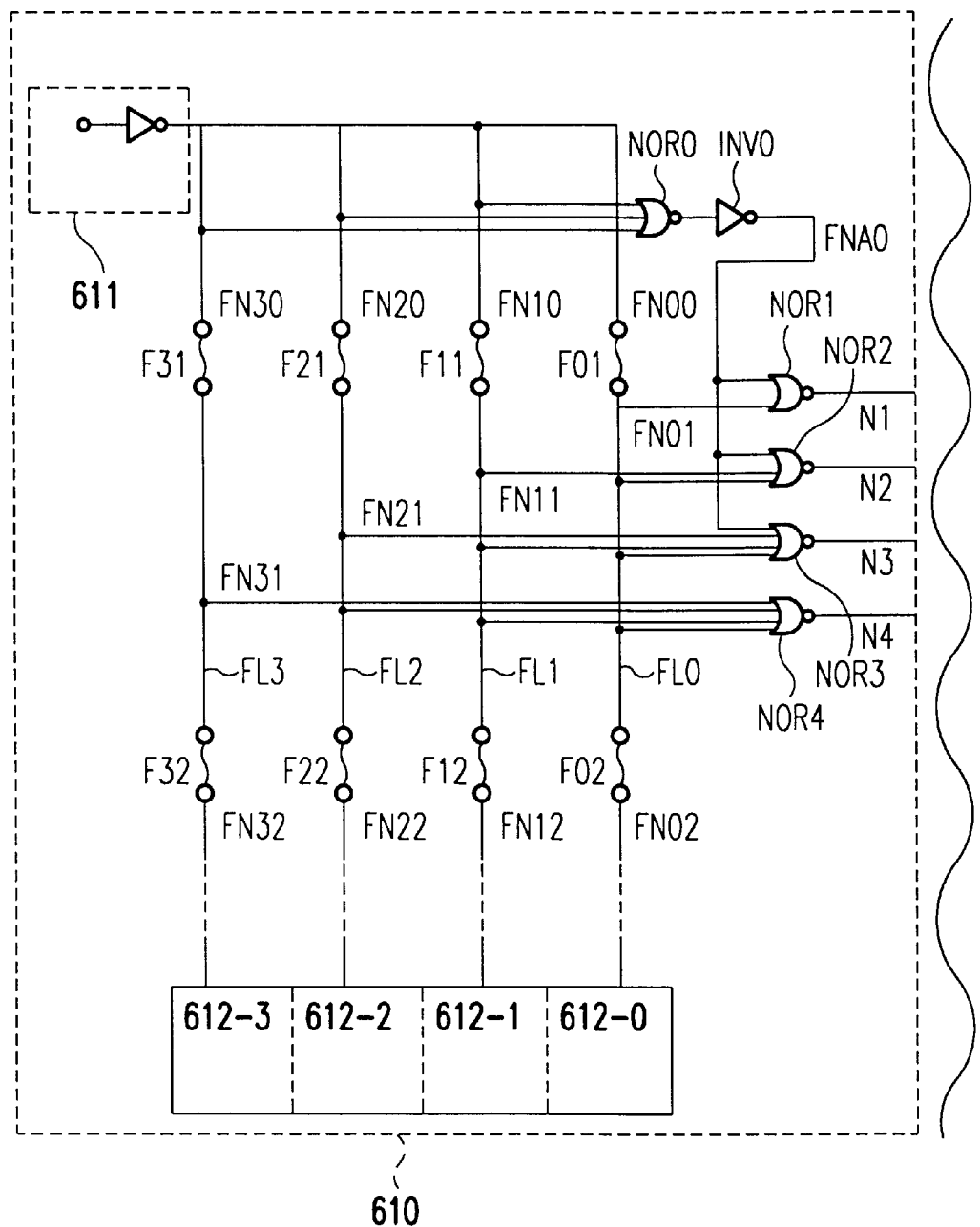
FIG. 11 is a circuit diagram showing a semiconductor memory device according to a sixth preferred embodiment.

FIG. 11 is a circuit diagram showing a semiconductor memory device according to the sixth preferred embodiment of the present invention. The difference between the sixth embodiment and the fifth embodiment resides in the circuit scheme of the redundant fuse circuit 610. The redundant fuse circuit 610 is a variation of the redundant circuit 510. The column decoder 120, the column decoder output switching circuit 130 and the column driver 140 are omitted from FIG. 11.

One feature of the sixth embodiment is to provide an NOR circuit NOR0 having three inputs and an inverter INV0 having an input terminal connected to an output terminal of the NOR0 and an output terminal connected to one of the input terminals of each NOR1 through NOR3 as illustrated in FIG. 11.

The circuit scheme of the lower portion below NOR4 is the same as the circuit scheme of the upper portion including NOR4. That is, there are other memory cell blocks below the NOR4. Accordingly, the circuit scheme of the lower portion and the explanation thereof are omitted from FIG. 11.

The redundant fuse circuit 610 has the first through the fourth fuse wiring paths FL0 to FL3. The first fuse wiring path FL0 includes fuses F01 and F02 which are connected in series through the fuse node FN01. The second fuse wiring path FL1 includes fuses F11 and F12 which are connected in series through the fuse node FN11. The third fuse wiring path FL2 includes fuses F21 and F22 which are connected in series through the fuse node FN21. The fourth fuse wiring path FL3 includes fuses F31 and F32 which are connected in series through the fuse node FN31. These fuses can be cut using a laser beam.

The redundant fuse circuit 610 also has the fuse driver 611 and first through fourth fuse node clamping circuits 612-0, 612-1, 612-2 and 612-3.

The fuse driver 611 and the fuse node clamping circuits 612-0, 612-1, 612-2 and 612-3 have the same elements as those of the fuse driver and the fuse node clamping circuit of the fifth embodiment.

The redundant fuse circuit 610 further has the NOR circuits NOR1 to NOR4. The NOR1 has a first input terminal connected to the fuse node FN01, a second input terminal connected to the fuse node FNA0 and an output terminal connected to the node N1. The NOR2 has a first input terminal connected to the fuse node FN01, a second input terminal connected to the fuse node FN11, a third input terminal connected to the node FNA0 and an output terminal connected to the node N2. The NOR3 has a first input terminal connected to the fuse node FN01, a second input terminal connected to the fuse node FN11, a third input terminal connected to the fuse node FN21, a fourth input terminal connected to the node FNA0 and an output terminal connected to the node N3. The NOR4 has a first input terminal connected to the fuse node FN01, a second input terminal connected to the fuse node FN11, a third input terminal connected to the fuse node FN21, a fourth input terminal connected to the fuse node FN31 and an output terminal connected to the node N4.

The redundant fuse circuit 610 further has the NOR circuit NOR0 and inverter INV0. The NOR0 has a first input terminal connected to the fuse node FN10, a second input terminal connected to the fuse node FN20, a third input terminal connected to the fuse node FN30 and the output terminal connected to the inverter INV0. The inverter INV0 has the input terminal connected to the NOR0 and the output terminal connected to the node FNA0.

The nodes N1 through N4 are output terminals of the redundant fuse circuit 610. The signals on the nodes N1 through N4 are transmitted to the column decoder output switching circuit 130.

Next, the operation of the semiconductor memory device as shown in FIG. 11 will be explained with reference to FIG. 12(A) through FIG. 12(C).

Case 1: No Fuses Have Been Cut

Figure 12A:
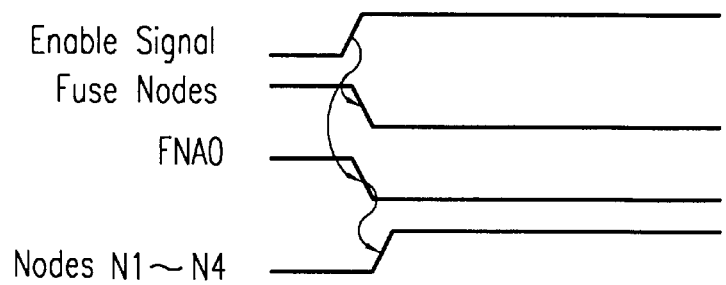
FIG. 12(a) to FIG. 12(c) are timing charts showing an operation of the sixth preferred embodiment.

FIG. 12(A) is a timing chart showing an operation of the present invention in the case where none of the fuses have been cut. That is, in this case, the redundant column lines RCL0 and RCL1 are not used.

When the enable signal is in the L level, the state of the memory device is not in the data reading mode or the data writing mode. Therefore, the fuse driver 611 outputs the H level in this period. The fuse node clamping circuit 612-0 to 612-3 output the H level. The NOR0 outputs the L level and the inverter INV0 outputs the H level. As a result, the nodes N1 through N4 are in the L level.

When the enable signal is changed from the L level to the H level, the state of the memory device changes to the data reading mode or the data writing mode.

The fuse wiring paths FL0, FL1, FL2 and FL3 are driven by the fuse driver 611 to the L level. (That is, all the fuse nodes FN00 to FN 32 are in the L level.) The NOR0 outputs the H level and the inverter INV0 outputs the L level.

Since all the input terminals of each NOR circuits NOR1 through NOR4 receive the L level, the nodes N1 through N4 are in the H level. So, the transmission gates T1, T3, T5 and T7 turn on and the transmission gates T2, T4, T6 and T8 turn off. (That is, only the upper side of the transmission gates turn on.) The decoded column address signals on the nodes N5 through N8 are transmitted to the nodes N9 through N12 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected in response to the column address signals AY0 and AY0B. For example, when the column address signal AY0B is in the H level, the inverter INV141 outputs the normal column line selection signal having the H level to the normal column line CL0. As a result, the transmission gate (not shown in the figure), which has the control terminal connected to the normal column line CL0, is in an active state and the data stored in the memory cell (not shown in the figure) which is connected to the transmission gate, is transferred to the data line through the activated transmission gate.

The operation for selecting the normal column lines CL1 through CL7 is the same as that of selecting the normal column line CL0.

As explained above, only the normal column lines CL0 through CL7 are used in this case that none of the fuses have been cut because the upper side transmission gates are activated. (The redundant column lines RCL0 and RCL1 are not used in this case because the lower side transmission gates are not activated.) That is, this operation indicates that the semiconductor memory device does not have any defective memory cells.

Case 2: Fuse F01 Has Been Cut

Figure 12B:
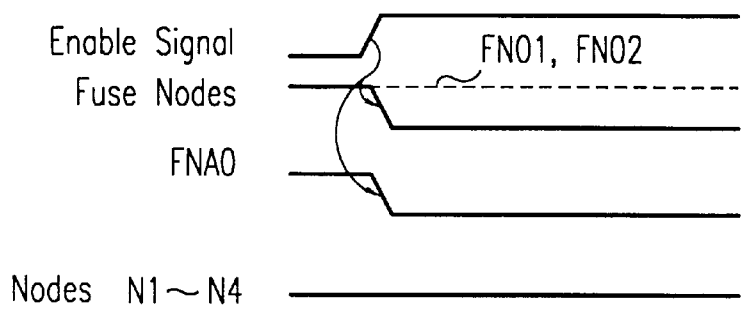

FIG. 12(B) is a timing chart showing an operation of the present invention in the case where the fuse F01 has been cut. That is, in this case, the redundant column lines RCL0 and RCL1 are used.

When the enable signal is in the L level, the state of the memory device is not in the data reading mode or the data writing mode. Therefore, the fuse driver 611 and the fuse node clamping circuits 612-0 through 612-3 output the H level in this period. The NOR0 outputs the L level and the inverter INV0 outputs the H level. Therefore, all the fuse nodes FN00 through FN32 are in the H level in this period.

When the enable signal is changed from the L level to the H level, the state of the memory device changes to the data reading mode or the data writing mode. The fuse node FN01 is not driven by the fuse driver 611 because the fuse F01 has been cut. The potential level on the fuse node FN01 is still in the H level and are clamped by the fuse node clamping circuit 612-0. On the contrary, the fuse wiring paths FL1 through FL3 are driven by the fuse driver 611 to the L level. So, the potential level on the fuse nodes FN10 trough FN32 are in the L level. The NOR0 outputs the H level and the inverter INV0 outputs the L level.

Since one of the input terminals of each NOR circuits NOR1 through NOR 4 receives the H level, the nodes N1 through N4 are in the L level. So, the transmission gates T2, T4, T6 and T8 turn on and the transmission gates T1, T3, T5 and T7 turn off. (That is, only the lower side of the transmission gates turn on.) The decoded column address signals on the nodes N5 through N8 are transmitted to the nodes N10 through N13 (not N9) respectively. If the column decoder 120 decodes the column address signal AYi and outputs the decoded column address signal having the L level to the node N5, the column decoder output switching circuit 130 outputs the signal having the H level to the node N10.

Therefore, one of the normal column lines CL2 and CL3 is selected instead of the normal column lines CL0 and CL1. For example, when the column address signal AY0B is in the H level, the inverter INV143 outputs the normal column line selection signal having the H level to the normal column line CL2. As a result, the transmission gate (not shown in the figure), which has the control terminal connected to the normal column line CL2, is in an active state and the data stored in the memory cell (not shown in the figure) which is connected to the transmission gate, is transferred to the data line through the activated transmission gate.

The operation for selecting the normal column lines CL3 through CL7 is the same as that of selecting the normal column line CL2.

If the column decoder 120 decodes the column address signal AYi and outputs the decoded column address signal having the L level to the node N8, the column decoder output switching circuit 130 outputs the signal having the H level to the node N13.

Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL0 and CL1 are not used and the redundant column lines RCL0 and RCL1 are used in this case where the fuse F01 has been cut because the memory cell that is selected by one of the normal column lines CL0 and CL1 has a defect. That is, this operation indicates that the redundancy memory cell is substituted for the defective memory cell.

Case 3: Fuse F21 Has Been Cut

Figure 12C:
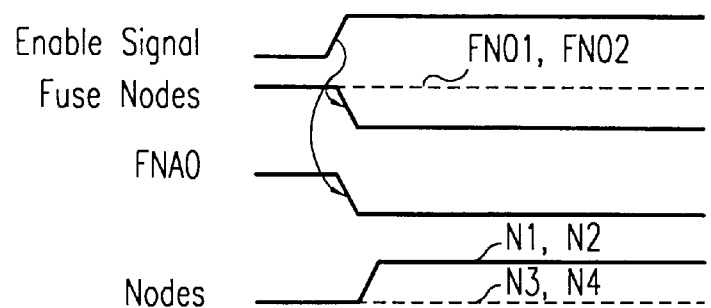

FIG. 12(C) is a timing chart showing an operation of the present invention in the case where the fuse F21 has been cut. That is, in this case, the redundant column lines RCL0 and RCL1 are used.

When the enable signal is in the L level, the state of the memory device is not in the data reading mode or the data writing mode. Therefore, the fuse driver 611 and the fuse node clamping circuits 612-0 through 612-3 output the H level in this period. Therefore, the fuse nodes FN00 through FN32 are in the H level.

When the enable signal is changed from the L level to the H level, the state of the memory device changes to the data reading mode or the data writing mode. The fuse wiring paths FL0, FL1 and FL3 are driven by the fuse driver 611 to the L level. So, the potential level on the fuse nodes FN01, FN11 and FN31 are in the L level. On the contrary, the fuse node FN21 is not driven by the fuse driver 611 because the fuse F21 has been cut. The potential level on the node FN21 is still in the H level and is clamped by the fuse node clamping circuit 612-2. The NOR0 outputs the H level and the inverter INV0 outputs the L level.

Since one of the input terminals of each NOR circuits NOR3 and NOR4 receive the H level and the input terminals of NOR circuits NOR1 and NOR2 are in the L level, the nodes N1 and N2 are in the H level and the nodes N3 and N4 are in the L level. So, the transmission gates T1, T3, T6 and T8 turn on and the transmission gates T2, T4, T5 and T7 turn off.

The decoded column address signals on the nodes N5 and N6 are transmitted to the nodes N9 and N10 respectively. The decoded column address signals on the nodes N7 and N8 are transmitted to the nodes N12 and N13 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected. For example, when the column address signal AY0B is in the H level, the inverter INV141 outputs the normal column line selection signal having the H level to the normal column line CL0.

If the column decoder 120 decodes the column address signal AYi and outputs the decoded column address signal having the L level to the node N7, the column decoder output switching circuit 130 outputs the signal having the H level to the node N12. Therefore, one of the normal column lines CL6 and CL7 is selected instead of the normal column lines CL4 and CL5. For example, when the column address signal AY0B is in the H level, the inverter INV147 outputs the normal column line selection signal having the H level to the normal column line CL6.

If the column decoder 120 decodes the column address signal AYi and outputs the decoded column address signal having the L level to the node N8, the column decoder output switching circuit 130 outputs the signal having the H level to the node N13. Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL4 and CL5 are not used and the redundant column lines RCL0 and RCL1 are used in this case where the fuse F21 has been cut because the memory cell that is to be selected by one of the normal column lines CL4 and CL5 has a defect. That is, this operation indicates that the semiconductor memory device replaces the defective memory cell with the redundant memory cell.

If a memory cell associated with the normal column lines CL2 and CL3 has a defect, the defective memory cell can be replaced with the redundant memory cell by cutting the fuse F11. If a memory cell associated with the normal column lines CL6 and CL7 has a defect, the defective memory cell can be replaced with the redundant memory cell by cutting the fuse F31.

As mentioned above, the semiconductor memory device of the sixth preferred embodiment has the same advantages as that of the fifth preferred embodiment. Furthermore, compared with the fifth preferred embodiment, the sixth preferred embodiment has another advantage in that it is easy to arrange the wirings which are to be arranged between the fuse nodes FN10 to FN30 and NOR1 to NOR3.

That is, since the sixth preferred embodiment has the NOR0 and the inverter INV0, only one wiring that extends in the vertical direction is required for the input terminals of NOR1 to NOR3. (It does not required complex wiring structure extended in the vertical direction.)

Accordingly, the area where the circuit element is arranged can be reduced.

Seventh Embodiment

A semiconductor memory device according to a seventh preferred embodiment of the present invention will be explained hereinafter in detail with reference to FIG. 13 and FIG. 14.

Figure 13:
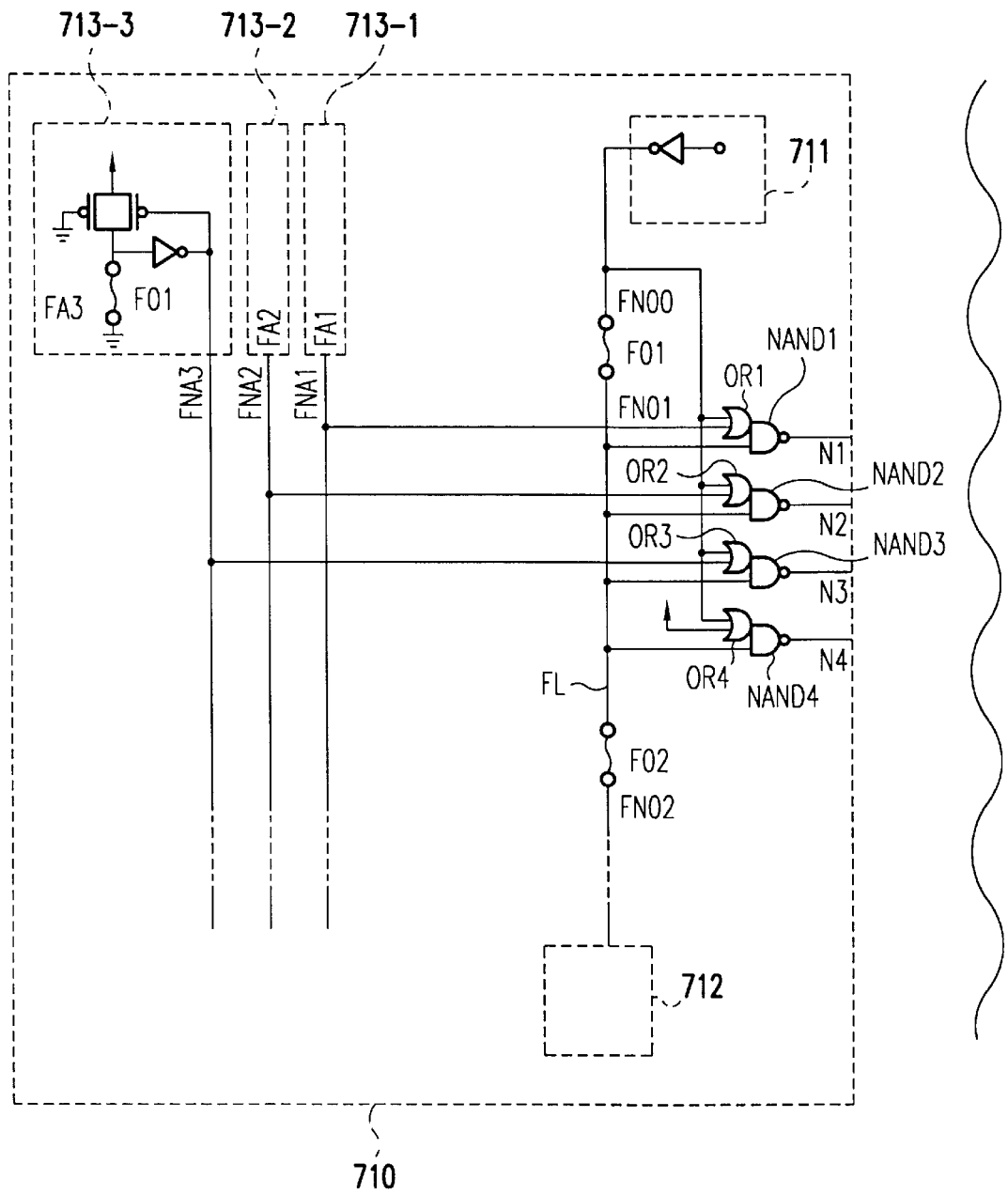
FIG. 13 is a circuit diagram showing a semiconductor memory device according to a seventh preferred embodiment.

FIG. 13 is a circuit diagram showing a semiconductor memory device according to the seventh preferred embodiment of the present invention. The difference between the seventh embodiment and the fifth embodiment resides in the circuit scheme of the redundant fuse circuit 710. The redundant fuse circuit 710 is a variation the redundant fuse circuit 510. The column decoder 120, the column decoder output switching circuit 130 and the column driver 140 are omitted from FIG. 13.

One feature of the seventh embodiment is that the number of the fuse wiring paths is decreased, each of which is connected to the NOR circuits NOR1 through NOR 4, compared to the fifth embodiment as illustrated in FIG. 13. That is, the seventh embodiment has a lesser number of fuse wiring paths than the fifth embodiment. (The seventh embodiment has only one fuse wiring path)

Furthermore, the seventh embodiment has fuse circuits 713-1, 713-2 and 713-3, each of which outputs redundant selection signals FNA1, FNA2 and FNA3 respectively, and OR circuits OR1 through OR4 and NAND1 through NAND4 as illustrated in FIG. 13.

Each of the fuse circuits 713-1, 713-2 and 713-3 has fuses FA1, FA2 and FA3 respectively. When the fuse (FA1, FA2 and FA3) is cut, the fuse circuit (713-1, 713-2 and 713-3) outputs the redundant selection signal (FNA1, FNA2 and FNA3) having the L level. On the contrary, when the fuse (FA1, FA2 and FA3) is not cut, the fuse circuit (713-1, 713-2 and 713-3) outputs the redundant selection signal (FNA1, FNA2 and FNA3) having the H level.

The NAND1 through NAND 4 are coupled to receive the output signal of the fuse driver 711, the signal on the fuse node of the fuse wiring path FL and the redundant selection signal.

The redundant fuse circuit 710 has the fuse wiring path FL. The fuse wiring path FL includes fuses F01 and F02 which are connected in series through the fuse node FN01. The fuses can be cut using a laser beam.

The redundant fuse circuit 710 also has the fuse driver 711 and the fuse node clamping circuit 712.

The fuse driver 711 and the fuse node clamping circuit 712 have the same elements as those of the fuse driver and the fuse node clamping circuit of the fifth embodiment.

The redundant fuse circuit 710 further has OR circuits OR1 to OR4. The OR1 has a first input terminal connected to the fuse node FN00, a second input terminal connected to the fuse circuit FA1 and an output terminal connected to the NAND1. The OR2 has a first input terminal connected to the fuse node FN00, a second input terminal connected to the fuse circuit FA2 and an output terminal connected to the NAND2. The OR3 has a first input terminal connected to the fuse node FN00, a second input terminal connected to the fuse circuit FA3 and an output terminal connected to the NAND3. The OR4 has a first input terminal connected to the fuse node FN00, a second input terminal connected to the power supply (such as VCC) and an output terminal connected to the NAND4.

The NAND1 has a first input terminal connected to the OR1, a second input terminal connected to the fuse node FN01, and an output terminal connected to the node N1. The NAND2 has a first input terminal connected to the OR2, a second input terminal connected to the fuse node FN01, and an output terminal connected to the node N2. The NAND3 has a first input terminal connected to the OR3, a second input terminal connected to the fuse node FN01, and an output terminal connected to the node N3. The NAND4 has a first input terminal connected to the OR4, a second input terminal connected to the fuse node FN01, and an output terminal connected to the node N4.

The nodes N1 through N4 are output terminals of the redundant fuse circuit 710. The signals on nodes N1 through N4 are transmitting to the column decoder output switching circuit 130.

Next, the operation of the semiconductor memory device as shown in FIG. 13 will be explained with reference to FIG. 14(A) through FIG. 14(C).

Case 1: No Fuses Have Been Cut

Figure 14A:
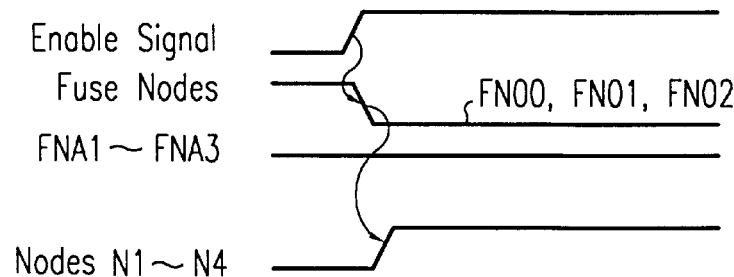
FIG. 14(a) to FIG. 14(c) are timing charts showing an operation of the seventh preferred embodiment.

FIG. 14(A) is a timing chart showing an operation of the present invention in the case where none of the fuses have been cut. That is, in this case, the redundant column lines RCL0 and RCL1 are not used.

When the enable signal is in the L level, the state of the memory device is not in the data reading mode or the data writing mode. Therefore, the fuse driver 711 outputs the H level in this period. The fuse node clamping circuit 712 outputs the H level. Since all input terminals of NAND1 through NAND4 are in the H level, the nodes N1 through N4 are in the L level.

When the enable signal is changed from the L level to the H level, the state of the memory device changes to the data reading mode or the data writing mode.

The fuse wiring path FL is driven by the fuse driver 711 to the L level. (That is, all fuse nodes FN00 to FN02 are in the L level.)

Since one of the input terminals of each NAND circuits NAND1 through NAND4 receives the L level, the nodes N1 through N4 are in the H level. So, the transmission gates T1, T3, T5 and T7 turn on and the transmission gates T2, T4, T6 and T8 turn off. (That is, only the upper side of the transmission gates turn on.) The decoded column signals on the nodes N5 through N8 are transmitted to the nodes N9 through N12 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected in response to the column address signals AY0 and AY0B. For example, when the column address signal AY0B is in the H level, the inverter INV141 outputs the normal column line selection signal having the H level to the normal column line CL0. As a result, the transmission gate (not shown in the figure), which has the control terminal connected to the normal column line CL0, is in an active state and the data stored in the memory cell (not shown in the figure) which is connected to the transmission gate, is transferred to the data line through the activated transmission gate.

The operation for selecting the normal column lines CL1 through CL7 is the same as that of selecting the normal column line CL0.

As explained above, only the normal column lines CL0 through CL7 are used in this case where none of the fuses have been cut because the upper side transmission gates are activated. (The redundant column lines RCL0 and RCL1 are not used in this case because the lower side transmission gates are not activated.) That is, this operation indicates that the semiconductor memory device does not have any defective memory cells.

Case 2: Fuse F01 Has Been Cut

Figure 14B:
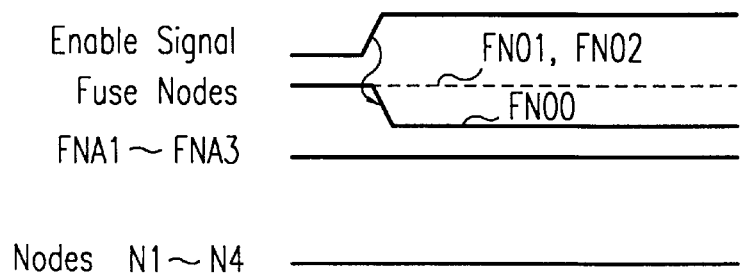

FIG. 14(B) is a timing chart showing an operation of the present invention in the case where the fuse F01 has been cut. That is, in this case, the redundant column lines RCL0 and RCL1 are used.

When the enable signal is in the L level, the state of the memory device is not in the data reading mode or the data writing mode. Therefore, the fuse driver 711 and the fuse node clamping circuit 712 output the H level in this period. Therefore, all the fuse nodes FN00 through FN02 are in the H level in this period.

When the enable signal is changed from the L level to the H level, the state of the memory device changes to the data reading mode or the data writing mode. The fuse node FN01 is not driven by the fuse driver 711 because the fuse F01 has been cut. The potential level on the fuse node FN01 is still in the H level and is clamped by the fuse node clamping circuit 712.

Since all the input terminals of each NAND circuits NAND1 through NAND4 receive the H level, the nodes N1 through N4 are in the L level. So, the transmission gates T2, T4, T6 and T8 turn on and the transmission gates T1, T3, T5 and T7 turn off. (That is, only the lower side of the transmission gates turn on.) The decoded column address signals on the nodes N5 through N8 are transmitted to the nodes N10 through N13 (not N9) respectively. If the column decoder 120 decodes the column address signal AYi and outputs the decoded column address signal having the L level to the node N5, the column decoder output switching circuit 130 outputs the signal having the H level to the node N10.

Therefore, one of the normal column lines CL2 and CL3 is selected instead of the normal column lines CL0 and CL1. For example, when the column address signal AY0B is in the H level, the inverter INV143 outputs a normal column line selection signal having the H level to the normal column line CL2. As a result, the transmission gate (not shown in the figure), which has the control terminal connected to the normal column line CL2, is in an active state and the data stored in the memory cell (not shown in the figure) which is connected to the transmission gate, is transferred to the data line through the activated transmission gate.

The operation for selecting the normal column lines CL3 through CL7 is the same as that of selecting the normal column line CL2.

If the column decoder 120 decodes the column address signal AYi and outputs the decoded column address signal having the L level on the node N8, the column decoder output switching circuit 130 outputs the signal having the H level to the node N13.

Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL0 and CL1 are not used and the redundant column lines RCL0 and RCL1 are used in this case where the fuse F01 has been cut because the memory cell that is selected by one of the normal column lines CL0 and CL1 has a defect. That is, this operation indicates that the redundancy memory cell is substituted for the defective memory cell.

Case 3: Fuses F01, FA1 and FA2 Have Been Cut

Figure 14C:
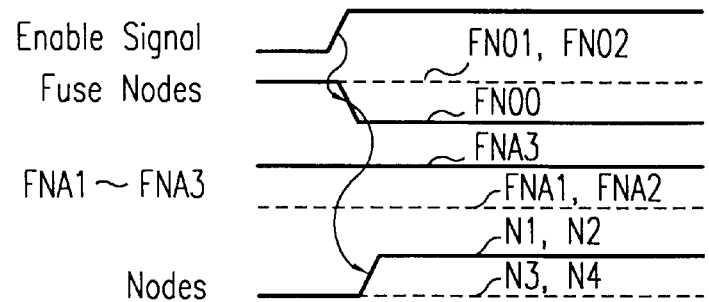

FIG. 14(C) is a timing chart showing an operation of the present invention in the case where the fuses F01, FA1 and FA2 have been cut. That is, in this case, the redundant column lines RCL0 and RCL1 are used.

When the enable signal is in the L level, the state of the memory device is not in the data reading mode or the data writing mode. Therefore, the fuse driver 711 and the fuse node clamping circuits 712 output the H level in this period. Therefore, the fuse nodes FN00 through FN02 are in the H level.

When the enable signal is changed from the L level to the H level, the state of the memory device changes to the data reading mode or the data writing mode. The fuse node FN00 is driven by the fuse driver 711 to the L level. So the potential level on the fuse node FN00 is in the L level. On the contrary, the fuse node FN01 is not driven by the fuse driver 711 because the fuse F01 has been cut. The potential level on the node FN01 is still in the H level and is clamped by the fuse node clamping circuit 712.

Since the fuse FA1 and FA2 also have been cut, OR1 and OR2 output the L level. Accordingly, one of the input terminals of each NAND circuits NAND1 and NAND2 receives the L level and all the input terminals of NAND circuits NAND3 and NAND4 are in the H level. So, the nodes N1 and N2 are in the H level and the nodes N3 and N4 are in the L level. Therefore, the transmission gates T1, T3, T6 and T8 turn on and the transmission gates T2, T4, T5 and T7 turn off.

The decoded column address signals on the nodes N5 and N6 are transmitted to the nodes N9 and N10 respectively. The decoded column address signals on the nodes N7 and N8 are transmitted to the nodes N12 and N13 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected. For example, when the column address signal AY0B is in the H level, the inverter INV141 outputs the normal column line selection signal having the H level to the normal column line CL0.

If the column decoder 120 decodes the column address signal AYi and outputs the decoded column address signal having the L level to the node N7, the column decoder output switching circuit 130 outputs the signal having the H level to the node N12. Therefore, one of the normal column lines CL6 and CL7 is selected instead of the normal column lines CL4 and CL5. For example, when the column address signal AY0B is in the H level, the inverter INV147 outputs the normal column line selection signal having the H level to the normal column line CL6.

If the column decoder 120 decodes the column address signal AYi and outputs the decoded column address signal having the L level to the node N8, the column decoder output switching circuit 130 outputs the signal having the H level to the node N13. Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the transmission gate.

As explained above, the normal column lines CL4 and CL5 are not used and the redundant column lines RCL0 and RCL1 are used in this case that the fuse F21 has been cut because the memory cell that is to be selected by one of the normal column lines CL4 and CL5 has a defect. That is, this operation indicates that the semiconductor memory device replaces the defective memory cell with the redundant memory cell.

If a memory cell associated with the normal column lines CL2 and CL3 has a defect, the defective memory cell can be replaced with the redundant memory cell by cutting the fuse F01, FA1. If a memory cell associated with the normal column lines CL6 and CL7 has a defect, the defective memory cell can be replaced with the redundant memory cell by cutting the fuse F01, FA1, FA2 and FA3.

As mentioned above, the semiconductor memory device of the seventh preferred embodiment has an advantage in that it reduce the circuit size because only one fuse wiring path extends in the vertical direction per memory cell block and includes one fuse is required for the redundancy operation per memory cell block.

Furthermore, the seventh preferred embodiment has another advantage in that the wiring path for transmitting the redundant selection signal does not need any fuses. That is, the wiring path comprises simple wiring. The fuse circuit can be arranged in an open space. Accordingly, it is easy to arrange the redundant fuse circuit.

Eighth Embodiment

A semiconductor memory device according to a eighth preferred embodiment of the present invention will be explained hereinafter in detail with reference to FIG. 15, FIG. 16 and FIG. 17.

Figure 15:
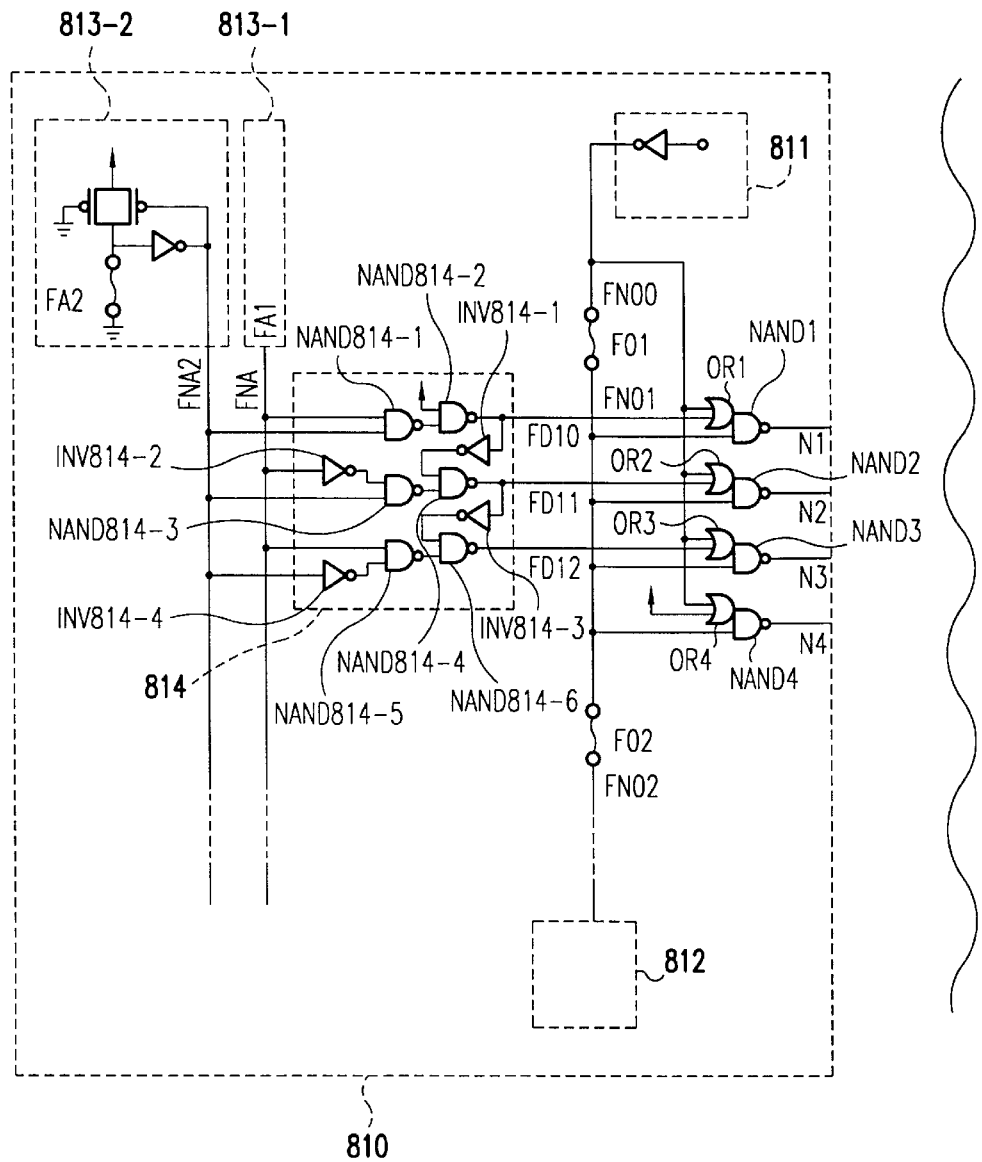
FIG. 15 is a circuit diagram showing a semiconductor memory device according to a eighth preferred embodiment.

FIG. 15 is a circuit diagram showing a semiconductor memory device according to the eighth preferred embodiment of the present invention. The difference between the eighth embodiment and the seventh embodiment resides in the circuit scheme of the redundant fuse circuit 810. The redundant fuse circuit 810 is a varitation of the redundant fuse circuit 710. The column decoder 120, column decoder output switching circuit 130 and the column driver 140 are omitted from FIG. 15.

One feature of the eighth embodiment is that the number of fuse circuits is decreased (That is, the number of redundant selection signal is decreased) compared to the seventh embodiment as illustrated in FIG. 15. That is, the eighth embodiment has a lesser number of fuse circuits than the seventh embodiment. (The eighth embodiment has two fuse circuit)

Furthermore, the eighth embodiment has a fuse selection decoder 814 which decodes the redundant selection signals FNA1 and FNA2 as illustrated in FIG. 15.

Each of the fuse circuits 813-1 and 813-2 has fuses FA1 and FA2 respectively. When the fuse (FA1 and FA2) is cut, the fuse circuit (813-1 and 813-2) outputs the redundant selection signal (FNA1 and FNA2) having the L level. On the contrary, when the fuse (FA1 and FA2) is not cut, the fuse circuit (813-1 and 713-2) outputs the redundant selection signal (FNA1 and FNA2) having the H level.

The fuse selection decoder 814 has inverters INV814-1 through INV814-4 and NAND circuits NAND 814-1 through 814-6. The fuse selection decoder 814 receives the redundant selection signals FNA1 and FNA2.

The NAND814-1 has a first input terminal coupled to receive the redundant selection signal FNA1, a second input terminal coupled to receive the redundant selection signal FNA2 and an output terminal connected to the NAND814-2. The NAND814-2 has a first input terminal connected to the power supply (fixed potential such as VCC), a second input terminal connected to the NAND814-1 and an output terminal outputting a decoded signal FD10. The inverter INV814-1 has an input terminal coupled to receive the decoded signal FD10 and an output terminal connected to the NAND814-4. The NAND814-3 has a first input terminal coupled to receive the redundant selection signal FNA1 through the inverter INV814-2, a second input terminal coupled to receive the redundant selection signal FNA2 and an output terminal connected to the NAND814-4. The NAND814-4 has a first input terminal connected to the inverter INV814-1, a second input terminal connected to the NAND814-3 and an output terminal outputting a decoded signal FD11. The inverter INV814-3 has an input terminal coupled to receive the decoded signal FD11 and an output terminal connected to the NAND814-6. The NAND814-5 has a first input terminal coupled to receive the redundant selection signal FNA1, a second input terminal coupled to receive the redundant selection signal FNA2 through the inverter INV814-4 and an output terminal connected to the NAND814-6. The NAND814-6 has a first input terminal connected to the inverter INV814-3, a second input terminal connected to the NAND814-5 and an output terminal outputting a decoded signal FD12.

The truth table of the output signal (decoded signal) of the fuse selection decoder 814 is shown in FIG. 17.

When the redundant selection signals FNA1 and FNA2 are in the H level, the fuse selection decoder 814 outputs the decoded signal FD10 having the H level, the decoded signal FD11 having the H level and the decoded signal FD12 having the H level. When the redundant selection signal FNA1 is in the L level and the redundant selection signal FNA2 is in the H level, the fuse selection decoder 814 outputs the decoded signal FD10 having the L level, the decoded signal FD11 having the H level and the decoded signal FD12 having the H level. When the redundant selection signal FNA1 is in the H level and the redundant selection signal FNA2 is in the L level, the fuse selection decoder 814 outputs the decoded signal FD10 having the L level, the decoded signal FD11 having the L level and the decoded signal FD12 having the H level. When the redundant selection signal FNA1 is in the L level and the redundant selection signal FNA2 is in the L level, the fuse selection decoder 814 outputs the decoded signal FD10 having the L level, the decoded signal FD11 having the L level and the decoded signal FD12 having the L level.

The NAND1 through NAND 4 are coupled to receive the output signal of the fuse driver 811, the signal on the fuse node of the fuse wiring path FL and the decoded signals from the fuse selection decoder 814.

The redundant fuse circuit 810 has the fuse wiring path FL. The fuse wiring path FL includes fuse F01 and F02 which are connected in series through the fuse node FN01. The fuses can be cut using a laser beam.

The redundant fuse circuit 810 also has the fuse driver 811 and the fuse node clamping circuit 812.

The fuse driver 811 and the fuse node clamping circuit 812 have the same elements of the fuse driver and the fuse node clamping circuit of the seventh embodiment.

The redundant fuse circuit 810 further has OR circuits OR1 to OR4. The OR1 has a first input terminal connected to the fuse node FN00, a second input terminal connected to the NAND814-2 and an output terminal connected to the NAND1. The OR2 has a first input terminal connected to the fuse node FN00, a second input terminal connected to the NAND814-4 and an output terminal connected to the NAND2. The OR3 has a first input terminal connected to the fuse node FN00, a second input terminal connected to the NAND814-6 and an output terminal connected to the NAND3. The OR4 has a first input terminal connected to the fuse node FN00, a second input terminal connected to the power supply (such as VCC) and an output terminal connected to the NAND4.

The NAND1 has a first input terminal connected to the OR1, a second input terminal connected to the fuse node FN01, and an output terminal connected to the node N1. The NAND2 has a first input terminal connected to the OR2, a second input terminal connected to the fuse node FN01, and an output terminal connected to the node N2. The NAND3 has a first input terminal connected to the OR3, a second input terminal connected to the fuse node FN01, and an output terminal connected to the node N3. The NAND4 has a first input terminal connected to the OR4, a second input terminal connected to the fuse node FN01, and an output terminal connected to the node N4.

The nodes N1 through N4 are output terminals of the redundant fuse circuit 810. The signals on nodes N1 through N4 are transmitting to the column decoder output switching circuit 130.

Next, the operation of the semiconductor memory device as shown in FIG. 15 will be explained with reference to FIG. 16(A) through FIG. 16(C) and FIG. 17.

Case 1: No Fuses Have Been Cut

Figure 16A:
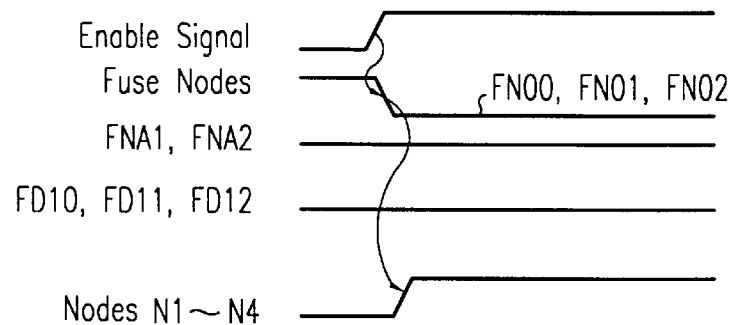
FIG. 16(a) to FIG. 16(c) are timing charts showing an operation of the eighth preferred embodiment.

FIG. 16(A) is a timing chart showing an operation of the present invention in the case where none of the fuses have been cut. That is, in this case, the redundant column lines RCL0 and RCL1 are not used.

When the enable signal is in the L level, the state of the memory device is not in the data reading mode or the data writing mode. Therefore, the fuse driver 811 outputs the H level in this period. The fuse node clamping circuit 812 outputs the H level. The decoded signals FD10 through FD12 are also in the H level because the fuses FA1 and FA2 have not been cut.

Therefore, all input terminals of NAND1 through NAND4 are in the H level and the nodes N1 through N4 are in the L level.

When the enable signal is changed from the L level to the H level, the state of the memory device changes to the data reading mode or the data writing mode.

The fuse wiring path FL is driven by the fuse driver 811 to the L level. (That is, all fuse nodes FN00 to FN02 are in the L level.)

Since one of the input terminals of each NAND circuits NAND1 through NAND4 receives the L level, the nodes N1 through N4 are in the H level. So, the transmission gates T1, T3, T5 and T7 turn on and the transmission gates T2, T4, T6 and T8 turn off. (That is, only the upper side of the transmission gates turn on.) The decoded column address signals on the nodes N5 through N8 are transmitted to the nodes N9 through N12 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 are selected in response to the column address signals AY0 and AY0B. For example, when the column address signal AY0B is in the H level, the inverter INV141 outputs the normal column line selection signal having the H level to the normal column line CL0. As a result, the transmission gate (not shown in the figure), which has the control terminal connected to the normal column line CL0, is in an active state and the data stored in the memory cell (not shown in the figure) which is connected to the transmission gate, is transferred to the data line through the activated transmission gate.

The operation for selecting the normal column lines CL1 through CL7 is the same as that of selecting the normal column line CL0.

As explained above, only the normal column lines CL0 through CL7 are used in this case where none of the fuses have been cut because the upper side transmission gates are activated. (The redundant column lines RCL0 and RCL1 are not used in this case, because the lower side transmission gates are not activated.) That is, this operation indicates that the semiconductor memory device does not have any defective memory cells.

Case 2: Fuse F01 Has Been Cut

Figure 16B:
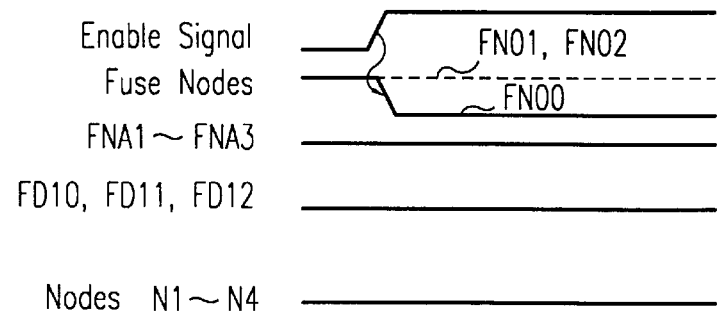

FIG. 16(B) is a timing chart showing an operation of the present invention in the case where the fuse F01 has been cut. That is, in this case, the redundant column lines RCL0 and RCL1 are used.

When the state of the memory device is not in the data reading mode or the data writing mode, the enable signal is in the L level. Therefore, the fuse driver 811 and the fuse node clamping circuit 812 output the H level in this period. Therefore, all the fuse nodes FN00 through FN02 are in the H level in this period.

When the enable signal is changed from the L level to the H level, the state of the memory device changes to the data reading mode or the data writing mode. The fuse node FN01 is not driven by the fuse driver 811, because the fuse F01 has been cut. The potential level on the fuse node FN01 is still in the H level and is clamped by the fuse node clamping circuit 812.

The decoded signals FD10 through FD12 are also in the H level because the fuses FA1 and FA2 have not been cut. Since all input terminals of each NAND circuits NAND1 through NAND4 receive the H level, the nodes N1 through N4 are in the L level.

So, the transmission gates T2, T4, T6 and T8 turn on and the transmission gates T1, T3, T5 and T7 turn off. (That is, only the lower side of the transmission gates turn on.) The decoded column address signals on the nodes N5 through N8 are transmitted to the nodes N10 through N13 (not N9) respectively. If the column decoder 120 decodes the column address signal AYi and outputs the decoded column address signal having the L level to the node N5, the column decoder output switching circuit 130 outputs the signal having the H level to the node N10.

Therefore, one of the normal column lines CL2 and CL3 is selected instead of the normal column lines CL0 and CL1. For example, when the column address signal AY0B is in the H level, the inverter INV143 outputs the normal column line selection signal having the H level to the normal column line CL2. As a result, the transmission gate (not shown in the figure), which has the control terminal connected to the normal column line CL2, is in an active state and the data stored in the memory cell (not shown in the figure) which is connected to the transmission gate, is transferred to the data line through the activated transmission gate.

The operation for selecting the normal column lines CL3 through CL7 is the same as that of selecting the normal column line CL2.

If the column decoder 120 decodes the column address signal AYi and outputs the decoded column address signal having the L level to the node N8, the column decoder output switching circuit 130 outputs the signal having the H level to the node N13.

Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the activated transmission gate.

As explained above, the normal column lines CL0 and CL1 are not used and the redundant column lines RCL0 and RCL1 are used in this case where the fuse F01 is cut, because the memory cell that is selected by one of the normal column lines CL0 and CL1 has a defect. That is, this operation indicates that the redundant memory cell is substituted for the defective memory cell.

Case 3: Fuses F01 and FA2 Have Been Cut

Figure 16C:
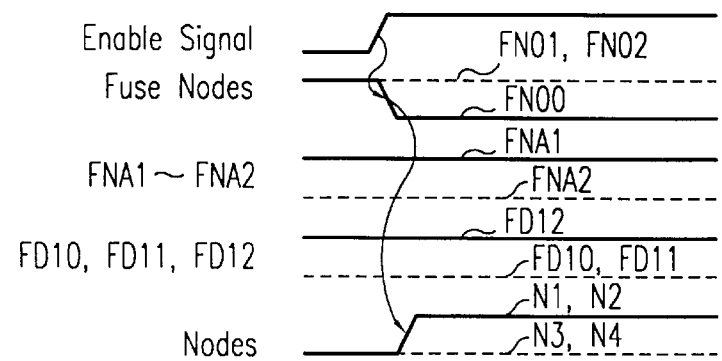
Figure 18:
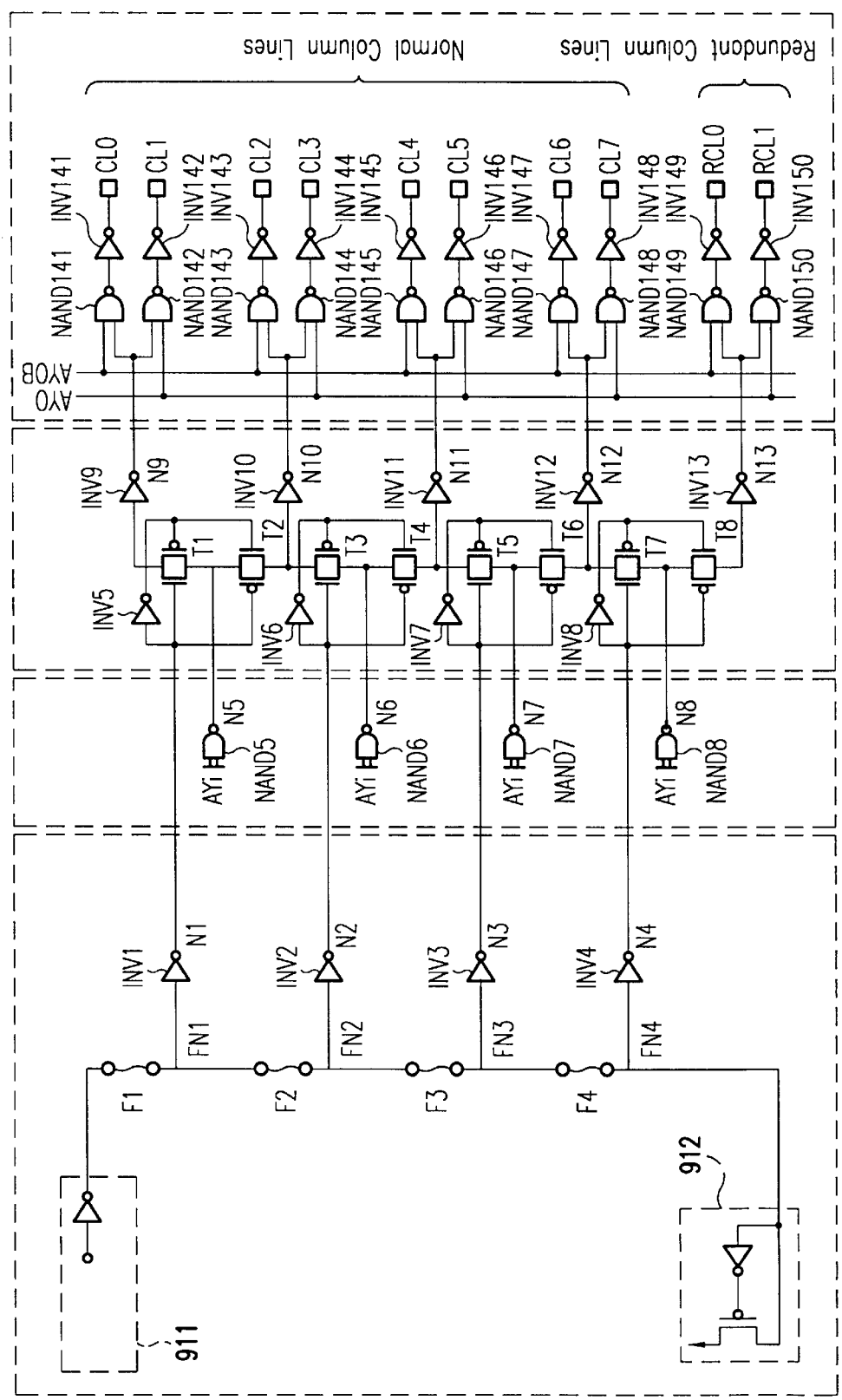
FIG. 18 is a circuit diagram of a related art.

FIG. 16(C) is a timing chart showing an operation of the present invention in the case where the fuses F01 and FA2 have been cut. That is, in this case, the redundant column lines RCL0 and RCL1 are used.

When the enable signal is in the L level, the state of the memory device is not in the data reading mode or the data writing mode. Therefore, the fuse driver 811 and the fuse node clamping circuits 812 output the H level in this period. Therefore, the fuse nodes FN00 through FN02 are in the H level.

When the enable signal is changed from the L level to the H level, the state of the memory device changes to the data reading mode or the data writing mode. The fuse node FN00 is driven by the fuse driver 811 to the L level. So the potential level on the fuse node FN00 is in the L level. On the contrary, the fuse node FN01 is not driven by the fuse driver 811 because the fuse F01 has been cut. The potential level on the node FN01 is still in the H level and is clamped by the fuse node clamping circuit 812. The decoded signals FD10 and FD11 are in the L level and the decoded signal FD12 is in the H level because the fuses FA2 has been cut. So, the OR1 and OR2 output the L level and OR 3 and OR4 output the H level.

Accordingly, one of the input terminals of each NAND circuits NAND1 and NAND2 receive the L level and all the input terminals of NAND circuits NAND3 and NAND4 are in the H level. As a result, the nodes N1 and N2 are in the H level and the nodes N3 and N4 are in the L level. Therefore, the transmission gates T1, T3, T6 and T8 turn on and the transmission gates T2, T4, T5 and T7 turn off.

The decoded column address signals on the nodes N5 and N6 are transmitted to the nodes N9 and N10 respectively. The decoded column address signals on the nodes N7 and N8 are transmitted to the nodes N12 and N13 respectively.

If the column decoder 120 decodes the column address signal AYi and outputs the decoded column address signal having the L level to the node N5, the column decoder output switching circuit 130 outputs the signal having the H level to the node N9. Therefore, one of the normal column lines CL0 and CL1 is selected. For example, when the column address signal AY0B is in the H level, the inverter INV141 outputs the normal column line selection signal having the H level to the normal column line CL0.

If the column decoder 120 decodes the column address signal AYi and outputs the decoded column address signal having the L level to the node N7, the column decoder output switching circuit 130 outputs the signal having the H level to the node N12. Therefore, one of the normal column lines CL6 and CL7 is selected instead of the normal column lines CL4 and CL5. For example, when the column address signal AY0B is in the H level, the inverter INV147 outputs the normal column line selection signal having the H level to the normal column line CL6.

If the column decoder 120 decodes the column address signal AYi and outputs the decoded column address signal having the L level to the node N8, the column decoder output switching circuit 130 outputs the signal having the H level to the node N13. Therefore, one of the redundant column lines RCL0 and RCL1 is selected instead of the normal column lines CL6 and CL7. For example, when the column address signal AY0B is in the H level, the inverter INV149 outputs the redundant column line selection signal having the H level to the redundant column line RCL0. As a result, the transmission gate (not shown in the figure), which has the control terminal connected to the redundant column line RCL0, is in an active state and the data stored in the redundant memory cell (not shown in the figure) which is connected to the transmission gate, is transferred to the data line through the transmission gate.

As explained above, the normal column lines CL4 and CL5 are not used and the redundant column lines RCL0 and RCL1 are used in this case where the fuse F21 has been cut because the memory cell that is to be selected by one of the normal column lines CL4 and CL5 has a defect. That is, this operation indicates that the redundant memory cell is substituted for the defective memory cell.

If a memory cell associated with the normal column lines CL2 and CL3 has a defect, the defective memory cell can be replaced with the redundant memory cell by cutting the fuse F01, FA1. If a memory cell associated with the normal column lines CL6 and CL7 has a defect, the defective memory cell can be replaced with the redundant memory cell by cutting the fuse F01, FA1, FA2.

As mentioned above, the semiconductor memory device of the eighth preferred embodiment may obtain the same advantages of the seventh preferred embodiment. Furthermore, the eighth preferred embodiment may obtain another advantage in that it is possible to decrease the number of fuse circuits because the fuse selection decoder decodes the logic signals from the fuse circuits. As a result, the circuit size may be reduced.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A semiconductor device comprising:
   a plurality of fuse wiring paths which extend substantially parallel to each other in a first direction, each of said fuse wiring paths having a fuse element;
   a normal column line which extends in a second direction substantially perpendicular to the first direction, said normal column line corresponding to a normal memory cell which stores data;
   a redundant column line which extends in the second direction, said redundant column line corresponding to a redundant memory cell which stores data;
   a logic circuit which receives a plurality of signals from said plurality of fuse wiring paths, respectively, and which outputs a selection signal according to the plurality of signals from said plurality of fuse wiring paths, said logic circuit having at least one logic element having a first input terminal coupled to one of said fuse wiring paths and a second input terminal coupled to a fixed voltage terminal; and a switching circuit, coupled between said logic circuit and said normal and redundant column lines, which receives an address signal and the selection signal, and which selectively transfers the address signal to said normal column line or said redundant column line in response to the selection signal.

2. A semiconductor device as set forth in claim 1, further comprising a fuse driver, coupled to said fuse wiring paths, which outputs a drive signal having a first voltage level during a first period and a second voltage level during a second period after the first period.

3. A semiconductor device comprising:

a first fuse wiring path, which extends in a first direction, having first and second ends, a first fuse node, and first and second fuse elements, wherein the first fuse element is connected between the first end and the first fuse node, and the second fuse element is connected between the first fuse node and the second end;

a second fuse wiring path, which extends substantially parallel to the first fuse wiring path in the first direction, having third and fourth ends, a second fuse node, and third and fourth fuse elements, wherein the third fuse element is connected between the third end and the second fuse node, and the fourth fuse is connected between the second fuse node and the fourth end;

a fuse driver, coupled to said first and second fuse wiring paths, which outputs a drive signal having a first voltage level during a first period and a second voltage level during a second period after the first period;

a plurality of normal column lines, each of which extends in a second direction substantially perpendicular to the first direction, said normal column lines corresponding to respective normal memory cells which store data;

a redundant column line which extends in the second direction, said redundant column line corresponding to a redundant memory cell which stores data;

a logic circuit which receives signals on the first and second fuse wiring paths and which outputs a selection signal according to the received signals; and a switching circuit, coupled between said logic circuit and said normal column lines and redundant column line, which receives an address signal and the selection signal, and which selectively transfers the received address signal to said normal column line or said redundant column line in response to the selection signal.

4. A semiconductor device as set forth in claim 3, said fuse driver comprising:

a first fuse driver, coupled to said first fuse wiring path, which outputs a first drive signal having a first voltage level during a first period and a second voltage level during a second period after the first period; and a second fuse driver, coupled to said second fuse wiring path, which outputs a second drive signal having the second voltage level during the first period and the first voltage level during the second period.

5. A semiconductor device as set forth in claim 3, wherein said normal column lines comprises:

first, second, third and fourth normal column lines;

wherein said logic circuit comprises:

a first logic circuit which receives a signal on the third end and a signal on the first fuse node, and which outputs a first selection signal according to the thus received signals;

a second logic circuit which receives the signal on the first fuse node and a signal on the second fuse node, and which outputs a second selection signal according to the thus received signals;

a third logic circuit which receives a signal on the second end and the signal on the second fuse node, and which outputs a third selection signal according to the thus received signals; and a fourth logic circuit which receives the signal on the second end and a signal on the fourth end, and which outputs a fourth selection signal according to the thus received signals;

wherein said switching circuit comprises:

a first switching circuit, coupled between said first logic circuit and said first and second normal column lines, which receives an address signal and the first selection signal, and which selectively transfers the address signal to said first normal column line or said second normal column line in response to the first selection signal;

a second switching circuit, coupled between said second logic circuit and said second and third normal column lines, which receives an address signal and the second selection signal, and which selectively transfers the address signal to said second normal column line or said third normal column line in response to the second selection signal;

a third switching circuit, coupled between said third logic circuit and said third and fourth normal column lines, which receives an address signal and the third selection signal, and which selectively transfers the address signal to said third normal column line or said fourth normal column line in response to the third selection signal; and a fourth switching circuit, coupled between said fourth logic circuit and said fourth normal column line and said redundant column line, which receives an address signal and the fourth selection signal, and which selectively transfers the address signal to said fourth normal column line or said redundant column line in response to the fourth selection signal.

6. A semiconductor device as set forth in claim 5, further comprising a fuse driver coupled to said first and second fuse wiring paths and which outputs a drive signal having a first voltage level during a first period and a second voltage level during a second period after the first period.

7. A semiconductor device as set forth in claim 5, further comprising:

a first fuse driver, coupled to said first fuse wiring path, which outputs a first drive signal having a first voltage level during a first period and a second voltage level during a second period after the first period; and a second fuse driver, coupled to said second fuse wiring path, which outputs a second drive signal having the second voltage level during the first period and the first voltage level during the second period.

8. A semiconductor device as set forth in claim 5, wherein each of said first through fourth logic circuits includes a NOR circuit.

9. A semiconductor device as set forth in claim 5, wherein each of said first through fourth logic circuits includes a NAND circuit.

10. A semiconductor device comprising:
a plurality of fuse wiring paths which extend substantially parallel to each other in a first direction and each of which has first and second ends and a fuse element, each of the fuse elements having a first terminal connected to the first end and a second terminal connected to the second end, said fuse wiring paths comprising first, second, third and fourth fuse wiring paths;
a plurality of normal column lines which extend in a second direction substantially perpendicular to the first direction, said normal column lines corresponding to respective normal memory cells which stores data, said normal column lines comprising first, second, third and fourth normal column lines;
a redundant column line which extends in the second direction and io corresponding to a redundant memory cell which stores data;
a logic circuit which receives signals on each of the first terminals and the second terminals of the fuse elements and which outputs a selection signal according to the thus received signal, said logic circuit comprising
 a first logic circuit which receives signals on the first terminals of the first through the third fuse elements and a signal on the second terminal of the fourth fuse element, and which outputs a first selection signal according to the thus received signals,
 a second logic circuit which receives the signals on the first terminals of the first and second fuse elements, a signal on the second terminal of the third fuse element and the signal on the second terminal of the fourth fuse element, and which outputs a second selection signal according to the thus received signals,
 a third logic circuit which receives the signal on the first terminal of the first fuse element, a signal on the second terminal of the second fuse element and the signals on the second terminals of the third and fourth fuse elements, and which outputs a third selection signal according to the thus received signals, and
 a fourth logic circuit which receives a signal on the second terminal of the first fuse element and the signal on the second terminals of the second through fourth fuse elements, and which outputs a fourth selection signal according to the thus received signals; and
a switching circuit, coupled between said logic circuit and said normal column lines and said redundant column line, which receives an address signal and the selection signal, and which selectively transfers the address signal to said normal column line or said redundant column line in response to the selection signal, said switching circuit comprising
 a first switching circuit, coupled between said first logic circuit and said first and second normal column lines, which receives an address signal and the first selection signal, and which selectively transfers the address signal to said first normal column line or said second normal column line in response to the first selection signal,
 a second switching circuit, coupled between said second logic circuit and said second and third normal column lines, which receives an address signal and the second selection signal, and when selectively transfers the address signal to said second normal column line or said third normal column line in response to the second selection signal,
 a third switching circuit, coupled between said third logic circuit and said third and fourth normal column lines, which receives an address signal and the third selection signal, and which selectively transfers the address signal to said third normal column line or said fourth normal column line in response to the third selection signal, and
 a fourth switching circuit, coupled between said fourth logic circuit and said fourth normal column line and said redundant column line, which receives an address signal and the fourth selection signal, and which selectively transfers the address signal to said fourth normal column line or said redundant column line in response to the fourth selection signal.

11. A semiconductor device as set forth in claim 10, wherein each of said first through fourth logic circuits includes a NOR circuit.

12. A semiconductor device comprising:
a plurality of fuse wiring paths which extend substantially parallel to each other in a first direction and each of which has a first end, a second end and a fuse element, each of the fuse elements having a first terminal connected to the first end and a second terminal connected to the second end, said fuse wiring paths comprising first, second third and fourth wiring paths;
a plurality of normal column lines which extend in a second direction substantially perpendicular to the first direction, said normal column lines corresponding to respective normal memory cells which stores data, said normal column lines comprising first, second, third and fourth normal column lines;
a redundant column line which extends in the second direction and corresponding to a redundant memory cell which stores data;
a first logic circuit which receives signals on the first terminals of the fuse elements and outputs a signal according to the thus received signals, said first logic circuit receiving signals on the first terminals of the first through the third fuse elements;
a second logic circuit which receives signals on the second terminals of the fuse elements and the signal from said first logic circuit and, which outputs a selection signal according to the thus received signals, said second logic circuit comprising
 a third logic circuit which receives the signal from said first logic circuit and a signal on the second terminal of the fourth fuse element, and which outputs a first selection signal according to the thus received signals,
 a fourth logic circuit which receives the signal from said first logic circuit, a signal on the second terminal of the third fuse element and the signal on the second terminal of the fourth fuse element, and which outputs a second selection signal according to the thus received signals,
 a fifth logic circuit which receives the signal from said first logic circuit, a signal on the second terminal of the second fuse element and the signals on the second terminals of the third and fourth fuse elements, and which outputs a third selection signal according to the thus received signals, and
 a sixth logic circuit which receives a signal on the second terminal of the first fuse element and the signals on the second terminals of the second through fourth fuse elements, and which outputs a fourth selection signal according to the thus received signals; and a switching circuit, coupled between said second logic circuit and said normal column lines and said redundant column line, which receives an address signal and the selection signal, and which selectively transfers the address signal to said normal column lines or said redundant column line in response to the selection signal, said switching circuit comprising a first switching circuit coupled between said second logic circuit and said first and second normal column lines which receives an address signal and the first selection signal and which selectively transfers the address signal to said first normal column line or said second normal column line in response to the first selection signal, a second switching circuit coupled between said third logic circuit, and said second and third normal column lines, which receives an address signal and the second selection signal, and which selectively transfers the address signal to said second normal column line or said third normal column line in response to the second selection signal, a third switching circuit coupled between said fourth logic circuit and said third and fourth normal column lines, which receives an address signal and the third selection signal, and which selectively transfer the address signal to said third normal column line or said fourth normal column line in response to the third selection signal, and a fourth switching circuit coupled between said fifth logic circuit and said fourth normal column line and said redundant column line, which receives an address signal and the fourth selection signal, and which selectively transfers the address signal to said fourth normal column line or said redundant column line in response to the fourth selection signal.

13. A semiconductor device as set forth in claim 12, wherein each of said third through sixth logic circuits includes a NOR circuit.

14. A semiconductor device comprising:

a fuse wiring path which extends in a first direction and includes a first end, a second end and a fuse element, the fuse element having a first terminal connected to the first end and a second terminal connected to the second end;

a plurality of normal column lines which extend in a second direction substantially perpendicular to the first direction, said normal column lines corresponding to respective normal memory cells which stores data, said normal column lines comprising first, second, third and fourth normal column lines;

a redundant column line which extends in the second direction, said redundant column line corresponding to a redundant memory cell which stores data;

a fuse which outputs a redundant selecting signal, said fuse circuit comprising a first fuse circuit having a first fuse and which outputs a first redundant selecting signal according to the state of the first fuse, a second fuse circuit having a second fuse and which outputs a second redundant selecting signal according to the state of the second fuse, and a third fuse circuit having a third fuse and which outputs a third redundant selecting signal according to the state of the third fuse;;

a logic circuit which receives signals on the first terminals and the second terminals of the fuse element and the redundant selecting signal, and which outputs a selection signal according to the thus received signals, said logic circuit comprising a first logic circuit which receives signals on the first terminal of the fuse element, a signal on the second terminal of the fuse element and the first redundant selecting signal, and which outputs a first selection signal according to the thus received signals, a second logic circuit which receives the signal on the first terminal of the fuse element, a signal on the second terminal of the fuse element and the second redundant selecting signal, and which outputs a second selection signal according to the thus received signals, a third logic circuit which receives the signal on the first terminal of the fuse element, a signal on second terminal of the fuse element and the third redundant selecting, and which outputs a third selection signal according to the thus received signals, and a fourth logic circuit which receives a signal on the first terminal of the fuse element and the signal on the second terminal of the fuse element, and which outputs a fourth selection signal according to the thus received signals;

a switching circuit, coupled between said logic circuit and said normal column lines and said redundant column line, which receives an address signal and the selection signal, and which selectively transfers the address signal to said normal column line or said redundant column line in response to the selection signal, said switching circuit comprising a first switching circuit, coupled between said first logic circuit and said first and second normal column lines, which receives an address signal and the first selection signal, and which selectively transfers the address signal to said first normal column line or said second normal column line in response to the first selection signal, a second switching circuit, coupled between said second logic circuit and said second and third normal column lines, which receives an address signal and the second selection signal, and when selectively transfers the address signal to said second normal column line or said third normal column line in response to the second selection signal, a third switching circuit, coupled between said third logic circuit and said third and fourth normal column lines, which receives an address signal and the third selection signal, and which selectively transfers the address signal to said third normal column line or said fourth normal column line in response to the third selection signal, and a fourth switching circuit, coupled between said fourth logic circuit and said fourth normal column line and said redundant column line, which receives an address signal and the fourth selection signal, and which selectively transfers the address signal to said fourth normal column line or said redundant column line in response to the fourth selection signal.

15. A semiconductor device as set forth claim 14, further comprising:

a decoder circuit, coupled between said fuse circuit and said logic circuit, which decodes the redundant selecting signal, and which outputs a decoded result as the redundant selecting signal received by said logic circuit.

* * * * *